(12) United States Patent
Lee et al.

(10) Patent No.: US 9,514,980 B2
(45) Date of Patent: Dec. 6, 2016

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Hyo-Seok Lee, Gyeonggi-do (KR);
Seung-Jin Yeom, Gyeonggi-do (KR);
Sung-Won Lim, Gyeonggi-do (KR);
Seung-Hee Hong, Gyeonggi-do (KR);
Nam-Yeal Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/841,259

(22) Filed: Aug. 31, 2015

(65) Prior Publication Data

US 2015/0371891 A1  Dec. 24, 2015

Related U.S. Application Data

(62) Division of application No. 14/011,014, filed on Aug. 27, 2013, now Pat. No. 9,159,609.

(30) Foreign Application Priority Data

Apr. 12, 2013  (KR) .................... 10-2013-0040433

(51) Int. Cl.
| | |
|---|---|
| H01L 21/768 | (2006.01) |
| H01L 23/498 | (2006.01) |
| H01L 27/108 | (2006.01) |
| H01L 21/28 | (2006.01) |
| H01L 49/02 | (2006.01) |
| H01L 23/532 | (2006.01) |

(52) U.S. Cl.
CPC ..... *H01L 21/7682* (2013.01); *H01L 21/28008* (2013.01); *H01L 21/7685* (2013.01); *H01L 21/76802* (2013.01); *H01L 21/76855* (2013.01); *H01L 23/498* (2013.01); *H01L 27/10814* (2013.01); *H01L 27/10855* (2013.01); *H01L 28/60* (2013.01); *H01L 23/53271* (2013.01); *H01L 2924/0002* (2013.01)

(58) Field of Classification Search
CPC .......... H01L 21/764; H01L 21/76855; H01L 21/76897; H01L 29/92
USPC ........ 438/102, 381, 382, 625, 626, 653, 675
See application file for complete search history.

(56) References Cited

U.S. PATENT DOCUMENTS

| | | | | |
|---|---|---|---|---|
| 2009/0008623 A1* | 1/2009 | Lim | ................. | H01L 21/28518 257/4 |
| 2010/0038786 A1* | 2/2010 | Luoh | ................. | H01L 21/28518 257/751 |
| 2013/0292847 A1* | 11/2013 | Choi | ..................... | H01L 23/498 257/774 |
| 2014/0159194 A1* | 6/2014 | Song | ................... | H01L 29/0649 257/522 |

* cited by examiner

*Primary Examiner* — Thomas L Dickey
*Assistant Examiner* — Changhyun Yi
(74) *Attorney, Agent, or Firm* — IP & T Group LLP

(57) ABSTRACT

A method for fabricating a semiconductor device includes forming an insulation layer over a substrate; forming an open portion in the insulation layer; forming a sacrificial spacer over sidewalls of the open portion; forming, over the sacrificial spacer, a first conductive pattern in a lower section of the open portion; forming an ohmic contact layer over the first conductive pattern; forming an air gap by removing the sacrificial spacer; capping the air gap by forming a barrier layer over the ohmic contact layer; and forming a second conductive pattern over the barrier layer to fill an upper section of the open portion.

9 Claims, 29 Drawing Sheets

SEMICONDUCTOR DEVICE WITH AIR GAP AND METHOD FOR FABRICATING THE SAME

CROSS-REFERENCE TO RELATED APPLICATIONS

This application is a division of U.S. patent application Ser. No. 14/011,014 filed on Aug. 27, 2013, which claims priority of Korean Patent Application No. 10-2013-0040433, filed on Apr. 12, 2013. The disclosure of each of the foregoing application is incorporated herein by reference in its entirety.

BACKGROUND

1. Field

Exemplary implementations of the present invention relate to a semiconductor device, and more particularly, to a semiconductor device with an air gap and a method for fabricating the same.

2. Description of the Related Art

In general, a semiconductor device includes conductive structures formed with insulating materials provided therebetween. With high integration of the semiconductor device, a distance between the conductive structures has gradually decreased. Accordingly, parasitic capacitance between the conductive structures is increased. With the increase of parasitic capacitance, an operation speed of the semiconductor device is degraded.

In order to reduce parasitic capacitance, the dielectric constant of the insulating materials may be reduced. However, there is a limitation in reducing parasitic capacitance since the insulating materials have a relatively high dielectric constant.

SUMMARY

Various exemplary implementations of the present invention are directed to a semiconductor device that may reduce parasitic capacitance between adjacent conductive structures, and a method for fabricating the same.

An exemplary method for fabricating a semiconductor device includes forming an insulation layer over a substrate; forming an open portion in the insulation layer; forming a sacrificial spacer over sidewalls of the open portion; forming, over the sacrificial spacer, a first conductive pattern in a lower section of the open portion; forming an ohmic contact layer over the first conductive pattern; forming an air gap by removing the sacrificial spacer; capping the air gap by forming a barrier layer over the ohmic contact layer; and forming a second conductive pattern over the barrier layer to fill an upper section of the open portion.

An exemplary method for fabricating a semiconductor device includes forming a plurality of first conductive patterns over a substrate; forming an insulation layer over an entire surface of the substrate including the first conductive patterns; forming an open portion between the first conductive patterns by etching the insulation layer; forming a sacrificial spacer over sidewalls of the open portion; forming a second conductive pattern over the sacrificial spacer in a lower section of the open portion; forming an ohmic contact layer over the second conductive pattern; forming an air gap by removing the sacrificial spacer; capping the air gap by forming a barrier layer over the ohmic contact layer; and forming a third conductive pattern over the barrier layer to fill an upper section of the open portion.

An exemplary semiconductor device includes a plurality of conductive structures formed over a substrate, each of the plurality of conductive structures including a first conductive pattern; a second conductive pattern recessed between the plurality of conductive structures; an air gap formed between the first conductive pattern and the second conductive pattern; an ohmic contact layer formed over the second conductive pattern; a barrier pattern formed over the ohmic contact layer so as to cap the air gap; and a third conductive pattern over the barrier pattern.

The barrier pattern may comprise: a first barrier pattern formed over the ohmic contact layer to cap the air gap, the first barrier pattern being formed over a top surface and sidewalls of the ohmic contact layer, and over sidewalls of the conductive structures over the air gap; and a second barrier pattern formed over the first barrier pattern.

A portion of the first barrier pattern that is formed over a top surface and sidewalls of the ohmic contact layer may have a first thickness, and a portion of the first barrier pattern that is formed over the sidewalls of the conductive structures over the air gap may have a second thickness that is less than the first thickness.

Each of the plurality of first conductive patterns may comprise a bit line, and wherein the second conductive pattern, the ohmic contact layer, and the third conductive pattern may comprise a storage node contact plug.

The second conductive pattern may comprise a silicon-containing material, and the third conductive pattern may comprise a metal-containing material.

The exemplary semiconductor device may further comprise: a buried gate-type transistor comprising a gate electrode buried in the substrate, and a capacitor formed over the third conductive pattern.

An exemplary semiconductor device includes an insulation layer formed over a substrate, the insulation layer having an open portion exposing the substrate; and a plug structure formed in the open portion, wherein the plug structure comprises: a first plug recessed in the open portion and in contact with the substrate; an air gap formed between the first plug and sidewalls of the open portion, and an ohmic contact layer formed over the first plug; a barrier pattern formed over the ohmic contact layer and the air gap, wherein the barrier pattern caps the air gap; and a third conductive pattern formed over the barrier pattern.

The barrier pattern may comprise: a first barrier pattern formed over the ohmic contact layer to cap the air gap, the first barrier pattern being formed over a top surface and sidewalls of the ohmic contact layer, and formed over the sidewalls of the open portion over the air gap; and a second barrier pattern over the first barrier pattern.

A portion of the first barrier pattern that is formed over a top surface and sidewalls of the ohmic contact layer may have a first thickness, and a portion of the first barrier pattern that is formed over the sidewalls of the open portion over the air gap may have a second thickness that is less than the first thickness.

The ohmic contact layer may comprise a metal silicide. The first plug may comprise a silicon-containing material, and the second plug comprises a metal-containing material.

The exemplary semiconductor device may further comprise: a capacitor coupled to the plug structure; and a plurality of bit line structures coupled to the substrate, wherein the open portion is formed between the plurality of bit line structures, and the first plug is separated from sidewalls of the bit line structures by the air gap.

The exemplary semiconductor device may further comprise: a buried gate-type transistor comprising a gate electrode buried in the substrate, wherein the plug structure is coupled to a source/drain region of the buried gate-type transistor.

DETAILED DESCRIPTION

Figure 1A:
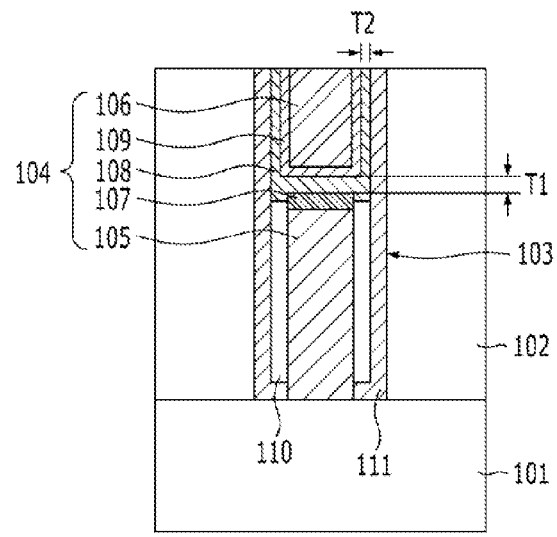
FIG. 1A is a cross sectional view illustrating an exemplary semiconductor device.

Various exemplary implementations of the present invention will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, like reference numerals refer to like parts throughout the various figures and implementations of the present invention.

The drawings are not necessarily to scale and in some instances, proportions may have been exaggerated in order to clearly illustrate features of the implementations. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1A is a cross sectional view illustrating an exemplary semiconductor device.

Referring to FIG. 1A, an insulation layer 102 is formed over a substrate 101. An open portion 103 is formed in the insulation layer 102 to expose a part of a surface of the substrate 101. A conductive structure 104 is formed in the open portion 103. The conductive structure 104 includes a first conductive pattern 105 and a second conductive pattern 106 formed over the first conductive pattern 105. An ohmic contact layer 107, a first barrier pattern 108 and a second barrier pattern 109 may be formed between the first conductive pattern 105 and the second conductive pattern 106. An air gap 110 is formed between the conductive structure 104 and sidewalls of the open portion 103. The first barrier pattern 108 is formed over the air gap 110 to cap the air gap 110. A spacer 111 may be formed over the sidewalls of the open portion 103.

The substrate 101 comprises a silicon substrate, a silicon germanium substrate, or the like. Furthermore, the substrate 101 may include a silicon-on-insulator (SOI) substrate. The insulation layer 102 may comprise silicon nitride, silicon oxide, or the like. The insulation layer 102 may include an inter-layer insulation layer.

The open portion 103 may have a hole shape or a line shape. For example, the open portion 103 may be defined such as a contact hole, a via hole, a through hole, a trench, a recess, or the like. When the open portion 103 comprises the through hole, the conductive structure 104 becomes a contact plug.

The first conductive pattern 105 and the second conductive pattern 106 may include polysilicon, metal, metal nitride, metal silicide, metal carbide, or the like. The first conductive pattern 105 and the second conductive pattern 106 may comprise the same conductive materials or different conductive materials from each other. For example, the first conductive pattern 105 may include a silicon-containing layer, and the second conductive pattern 106 may include a metal-containing layer. The first conductive pattern 105 may include polysilicon, and the second conductive pattern 106 may include tungsten. In a case where a silicon-containing first conductive pattern 105 contacts a metal-containing second conductive pattern 106, an ohmic contact is required. The ohmic contact layer 107 may be formed between the first conductive pattern 105 and the second conductive pattern 106. The ohmic contact layer 107 may include a metal silicide. The ohmic contact layer 107 may include cobalt silicide with a $CoSi_2$ phase.

The spacer 111 comprises materials having a low dielectric constant. The low dielectric constant materials may include an oxide or a nitride. The low dielectric constant materials may include silicon oxide, silicon nitride, or a metal oxide. The spacer 111 may comprise $SiO_2$, $Si_3N_4$, SiN, or the like.

The air gap 110 is formed by removing a sacrificial material that is formed between the spacer 111 and the first conductive pattern 105. After forming the ohmic contact layer 107, the air gap 110 is formed by removing the sacrificial material.

The first barrier pattern 108 is formed over a top surface and a part of sidewalls of the ohmic contact layer 107 to cap the air gap 110. Further, the first barrier pattern 108 is formed to cover the sidewalls of the open portion 103 over the air gap 110. A portion of the first barrier pattern 108 that is formed over the top surface and the part of the sidewalls of the ohmic contact layer 107 has a first thickness T1. A portion of the first barrier pattern 108 that is formed over the air gap 110 on the sidewalls that define the open portion 103 has a second thickness T2. The first thickness T1 is thicker than the second thickness T2. A physical vapor deposition in an ionized metal plasma (PVD-IMP) method may be used to make a difference between the first thickness T1 and the second thickness T2. Accordingly, the first barrier pattern 108 may block an opening of the air gap 110 without filling the air gap 110. The first barrier pattern 108 may comprise a titanium-containing layer. The first barrier pattern 108 may comprise a titanium layer. The titanium layer may be formed by using the PVD-IMP method. (Hereinafter, the titanium layer formed by using the PVD-IMP method is referred to as PVD-IMP Ti.) By using the PVD-IMP method, the first barrier pattern 108, which covers the top surface and the part of the sidewalls of the ohmic contact layer 107 is formed. As a result, since a contact area between the first barrier pattern 108 and the ohmic contact layer 107 increases, a contact resistance is improved.

The second barrier pattern 109 may comprise a titanium-containing layer. The second barrier pattern 109 may comprise a titanium nitride (TiN) layer. The TiN layer may be formed by using a chemical vapor deposition (CVD) method. (Hereinafter, the TiN layer formed by using the CVD method is referred to as CVD TiN.) Accordingly, since the second barrier pattern 109 has excellent step coverage, the second barrier pattern 109 is formed to have a uniform thickness.

As described above, a barrier pattern is formed by stacking the first barrier pattern 108 of PVD-IMP Ti and the second barrier pattern 109 of CVD TiN. In another exemplary implementation, the barrier pattern may be formed to have a single layer of PVD-IMP Ti using a PVD-IMP method.

The conductive structure 104, which is formed by stacking the first conductive pattern 105, the ohmic contact layer 107, the first barrier pattern 108, the second barrier pattern 109, and the second conductive pattern 106, may be a plug structure. The first conductive pattern 105 may comprise a silicon plug, and the second conductive pattern 106 may comprise a metal plug. Though not illustrated, a gate electrode buried in the substrate 101, and a buried gate-type transistor comprising source/drain regions formed in the substrate 101 may be formed. The plug structure 104 may be coupled to the source/drain regions of the buried gate-type transistor. Further, another conductive structure may be formed over the second conductive pattern 106. The conductive structure may comprise a storage node of a capacitor.

In FIG. 1A, the air gap 110 is stably capped by the first barrier pattern 108. Due to the air gap 110, an electrical insulating characteristic of the conductive structure 104 may be improved. That is, if another conductive pattern is disposed adjacent to the first conductive pattern 105, then a parasitic capacitance between two conductive patterns may be reduced.

Furthermore, by forming the ohmic contact layer 107 prior to forming the air gap 110, a space sufficient to form the second conductive pattern 106 may be secured. In addition, by enlarging an area to form the ohmic contact layer 107, a contact resistance may be improved.

Figure 1B:
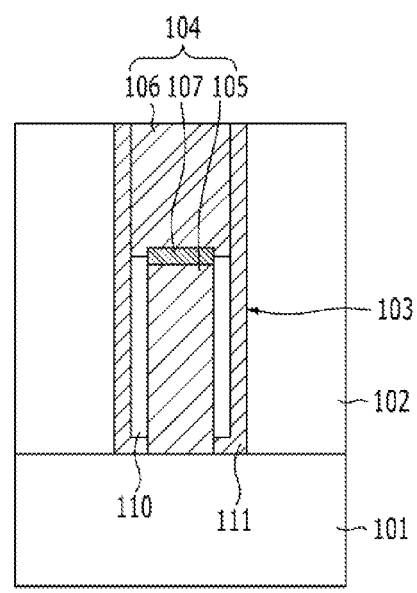
FIG. 1B is a cross sectional view illustrating a modification of an exemplary semiconductor device shown in FIG. 1A.

FIG. 1B is a cross sectional view illustrating a modification of the exemplary semiconductor device of FIG. 1A.

Referring to FIG. 1B, the air gap 110 and the ohmic contact layer 107 may be capped using only the second conductive pattern 106, without the first barrier pattern 108 and the second barrier pattern 109. Thus, conductive structure 104 (shown in FIG. 1B) may comprise a stack structure of the first conductive pattern 105, the ohmic contact layer 107, and the second conductive pattern 106.

FIGS. 2A to 2H are cross sectional views Illustrating an exemplary method for fabricating the semiconductor device of FIGS. 1A and 1B.

Figure 2A:
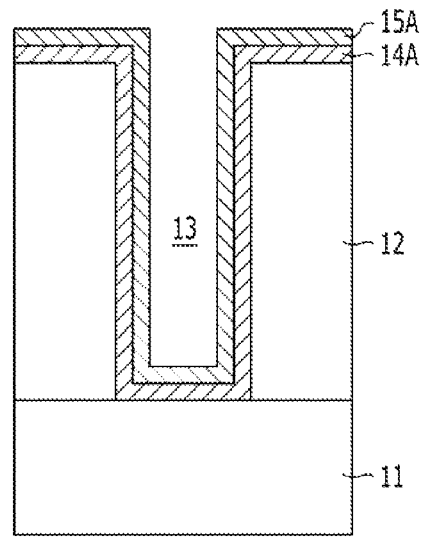
FIGS. 2A to 2H are cross sectional views illustrating an exemplary method for fabricating the semiconductor device of FIGS. 1A and 1B.
Figure 2B:
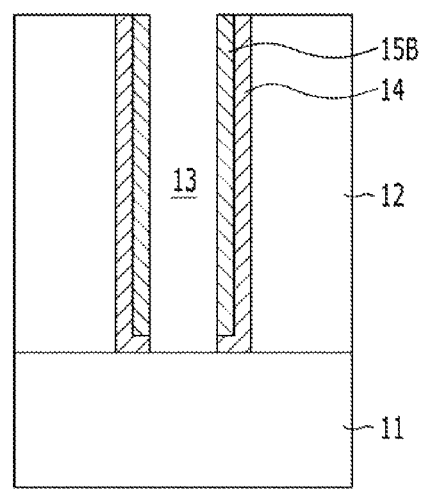

Referring to FIG. 2A, a first insulation layer 12 is formed over a substrate 11. The substrate 11 comprises a semiconductor substrate. The substrate 11 contains silicon. The substrate 11 may comprise a silicon substrate, a silicon germanium substrate, or the like. Furthermore, the substrate 11 may include a silicon-on-Insulator (SOI) substrate. The first insulation layer 12 comprises low-k materials, such as silicon nitride, silicon oxide, or the like.

An open portion 13 is formed in the first insulation layer 12 by etching the first insulation layer 12 to expose a surface of the substrate 11. The open portion 13 has a hole shape or a line shape. For example, the open portion 13 may be a contact hole, a via hole, a through hole, a trench, a recess, or the like. An open array may be formed by regularly arranging a plurality of open portions 13 at a certain interval. A mask pattern (not shown) may be used to etch the first insulation layer 12. The mask pattern may comprise a photoresist pattern, a hard mask pattern that which is patterned by a photoresist pattern, or the like.

A second insulation layer 14A is formed over the entire surface of the resulting structure including the first insulation layer 12 and the open portion 13. The second insulation layer 14A is conformally formed. The second insulation layer 14A comprises a low-k material. The second insulation layer 14A may comprise silicon nitride, silicon oxide, or the like.

A sacrificial layer 15A is formed over the second insulation layer 14A. The sacrificial layer 15A is conformally formed. The sacrificial layer 15A includes a material that is removed by a wet etch. The material used as the sacrificial layer 15A may have an etch selectivity that is higher than an etch selectivity of the first insulation layer 12 and the second insulation layer 14A. The sacrificial layer 15A may include a metal nitride. The sacrificial layer 15A may include titanium nitride (TiN).

Referring to FIG. 2S, a sacrificial spacer 15S is formed by etching the sacrificial layer 15A, and a spacer 14 is formed by etching the second insulation layer 14A. As a result, a dual spacer structure of the spacer 14 and the sacrificial spacer 15B is formed over sidewalls defining the open portion 13. An etch-back process is used to etch the spacer 14 and the sacrificial spacer 15B. By forming the spacer 14 and the sacrificial spacer 15B, a surface of the substrate 11 is exposed via the open portion 13.

Figure 2C:
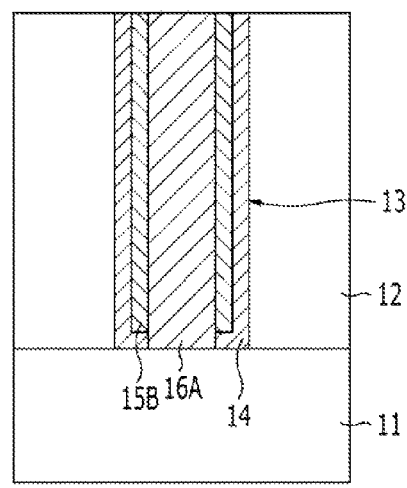

Referring to FIG. 2C, a first conductive layer (not shown) is formed over the entire surface of the resulting structure including the sacrificial spacer 15B and the first insulation layer 12. Then, the first conductive layer is selectively etched, thereby forming a first conductive pattern 16A filling the open portion 13. The first conductive pattern 16A is formed by etching the first conductive layer over the first insulation layer 12 except for the first conductive pattern in the open portion 13. The first conductive pattern 16A may comprise a silicidable material. The first conductive pattern 16A may comprise a silicon-containing layer. The first conductive pattern 16A may include polysilicon. The first conductive pattern 16A is in contact with the surface of the substrate 11.

Figure 2D:
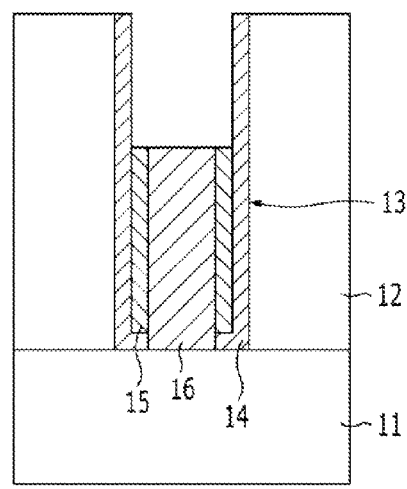

Referring to FIG. 2D, a recessed structure is formed by recessing the first conductive pattern 16A and the sacrificial spacer 15B. The recessed structure is formed by recessing an upper portion of the first conductive pattern 16A and the sacrificial spacer 15B to a certain depth. The recessed first conductive pattern 16A and sacrificial spacer 15B are represented by reference numeral "16" and "15," respectively. The recessed structure comprises the first conductive pattern 16 and the sacrificial spacer 15. At this time, the first conductive pattern 16A and the sacrificial spacer 15B may be simultaneously recessed, or independently recessed. An etch-back process may be applied to recess the first conductive pattern 16A and the sacrificial spacer 15B.

Figure 2E:
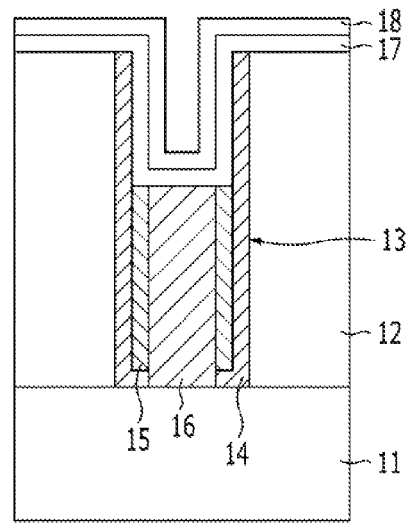

Referring to FIG. 2E, a silicidable layer 17 is formed. The silicidable layer 17 is conformally formed over the entire surface of the resulting structure including the recess structure. The silicidable layer 17 comprises a material that forms a metal silicide through a silicidation reaction with the first conductive pattern 16. The silicidable layer 17 may comprise a silicidable metal layer. The silicidable metal layer may include a metal-containing layer comprising metal atoms, such as cobalt. If the first conductive pattern 16 comprises polysilicon, then the silicidable layer 17 may comprise cobalt.

A protection layer 18 is formed over the silicidable layer 17. The protection layer 18 is conformally formed over the silicidable layer 17. The protection layer 18 prevents an attack of the silicide layer during a subsequent silicidation process. The protection layer 18 may comprise a metal nitride. The protection layer 18 may comprise a titanium-containing layer. The protection layer 18 may comprise titanium nitride. The protection layer 18 may be formed by stacking titanium and titanium nitride.

Figure 2F:
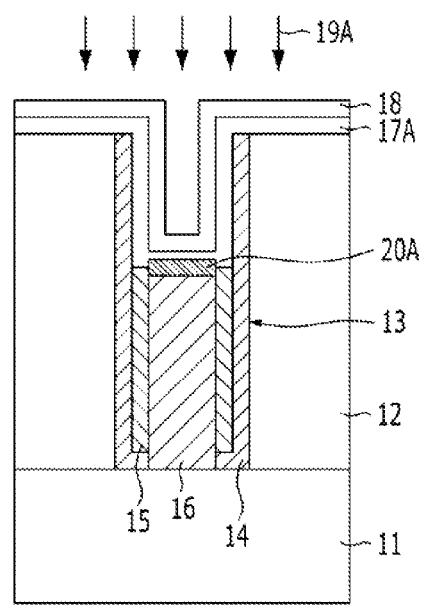

Referring to FIG. 2F, a first annealing process 19A is performed. At this time, since the silicidation reaction occurs due to the first annealing process 19A, the first conductive pattern 16 reacts with the silicidable layer 17 to form an ohmic contact layer 20A. In other words, the silicidation reaction occurs at an interface between the first conductive pattern 16 and the silicidable layer 17, thereby forming the ohmic contact layer 20A comprising a metal silicide layer. The first annealing process 19A may be performed at a temperature above at least 200° C. to cause the silicidation reaction between the first conductive pattern 16 and the silicidable layer 17. The first annealing process 19A may comprise a rapid thermal annealing (RTA) process. Through the first annealing process 19A, silicon of the first conductive pattern 16 react with metal of the silicidable layer 17 to form the ohmic contact layer 20A. The ohmic contact layer 20A may include a metal silicide. The ohmic contact layer 20A may include a cobalt silicide. In an exemplary implementation, the ohmic contact layer 20A may include cobalt silicide with $CoSi_x$ phase. Preferably, the first annealing process 19A is performed at a temperature ranging from approximately 400° C. to approximately 600° C. Through the first annealing process 19A, the ohmic contact layer 20A of cobalt silicide is formed to have $CoSi_x$ phase, x being from about 0.1 to about 1.5.

After forming the ohmic contact layer 20A, any unreacted silicidable layer may be left as represented by reference numeral 17A.

Figure 2G:
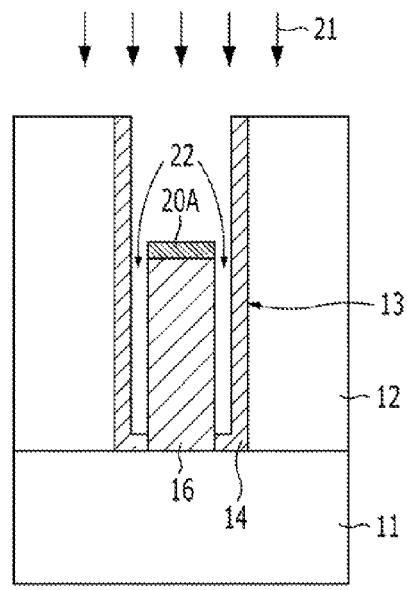

Referring to FIG. 2G, a strip process 21 is performed to remove the protection layer 18 and the unreacted silicidable layer 17A. The strip process 21 may be performed through a wet cleaning process. For example, the cleaning process may be performed using a chemical based on $H_2SO_4$ (SPM) or $NH_4OH$ (SC-1). Since the sacrificial spacer 15 comprises titanium nitride, the sacrificial spacer 15 is also removed through the strip process 21. As a result, the protection layer 18, the unreacted silicidable layer 17A, and the sacrificial spacer 15 are removed by using a single strip process. Accordingly, a loss of surrounding structures may be minimized, and the process may be simplified.

As described above, the sacrificial spacer 15 is removed through the strip process 21, and a space occupied by the sacrificial spacer 15 remains as an air gap 22. Since the air gap 22 is formed as a result of the strip process 21, a loss of the air gap 22 does not occur.

The air gap 22 is formed between the first conductive pattern 16 and the sidewalls that define the open portion 13. An insulation structure, including an air gap spacer 14, is formed between the first conductive pattern 16 and the sidewalls that define the open portion 13.

Figure 2H:
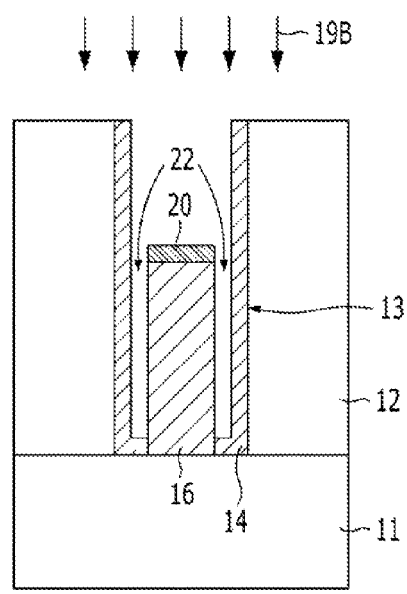

Referring to FIG. 2H, a second annealing process 19B is performed. The second annealing process 19B may comprise a rapid thermal annealing (RTA) process. The second annealing process 19B may be performed at a temperature greater than the first annealing process 19A. The second annealing process 19B is performed at a temperature ranging from approximately 600° C. to approximately 800° C. The ohmic contact layer 20A has a phase changed by the second annealing process 19B. Thus, a phase-changed ohmic contact layer is represented by reference numeral 20. In other words, through the first annealing process 19A, the ohmic contact layer 20A of cobalt silicide having $CoSi_x$ phase (x being from about 0.1 to about 1.5) is formed, and through the second annealing process 19B, the ohmic contact layer 20A, which is made of cobalt silicide having $CoSi_x$ phase (x=about 0.1~about 1.5), is changed into the ohmic contact layer 20 of cobalt silicide having a $CoSi_2$ phase. For reference, from among cobalt silicides, cobalt silicide having a $CoSi_2$ phase has the lowest resistivity.

Since the $CoSi_2$ phase cobalt silicide is used as the ohmic contact layer 20, contact resistance may be improved and cobalt silicide having sufficient low resistance even in the small area of the open portion 13 having a fine line width may also be formed.

Figure 3A:
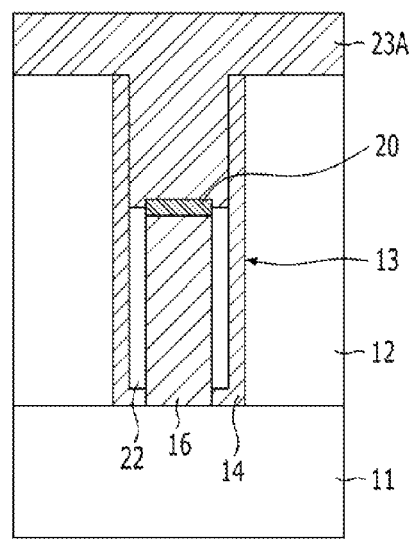
FIGS. 3A and 3B illustrate an exemplary method for capping an air gap.
Figure 3B:
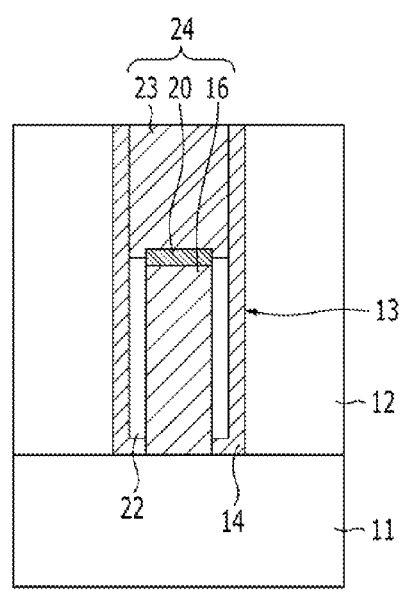

FIGS. 3A and 3B illustrate an exemplary method for capping an air gap.

Referring to FIG. 3A, a second conductive layer 23A is formed over the entire surface of the resulting structure including the air gap 22 and the ohmic contact layer 20. The second conductive layer 23A is formed to cap the air gap 22. In this case, the second conductive layer 23A may block an opening of the air gap 22 without filling the air gap 22, since a space of the air gap 22 is narrow. The second conductive layer 23A is formed over the ohmic contact layer 20 to fill the open portion 13, without filling the air gap 22. Further, the second conductive layer 23A may be formed to cover a part of sidewalls of the ohmic contact layer 20. The second conductive layer 23A may comprise a metal-containing layer. The second conductive layer 23A may comprise a tungsten layer.

Referring to FIG. 3B, a planarization process is performed on the second conductive layer 23A. The planarization process may comprise, for example, an etch-back process, or a chemical mechanical polishing (CMP) process.

Through the planarization process, a second conductive pattern 23 is formed. Thus, a conductive structure 24, which is formed in the open portion 13, comprises the first conductive pattern 16, the ohmic contact layer 20, and the second conductive pattern 23. The ohmic contact layer 20 forms an ohmic contact between the first conductive pattern 16 and the second conductive pattern 23. The air gap 22 is formed between the first conductive pattern 16 and the sidewalls that define the open portion 13. As a result, an insulation structure including the air gap spacer 14 is formed between the first conductive pattern 16 and the sidewalls of the open portion 13.

Figure 4A:
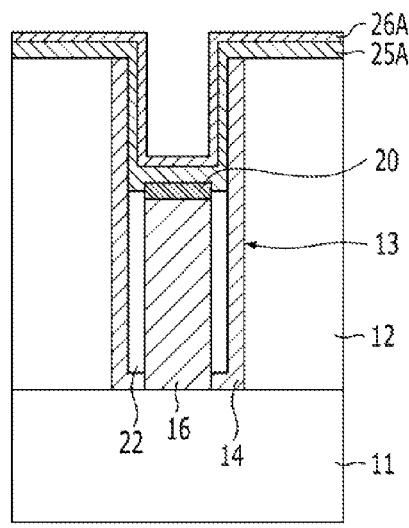
FIGS. 4A to 4C illustrate another exemplary method for capping an air gap.
Figure 4B:
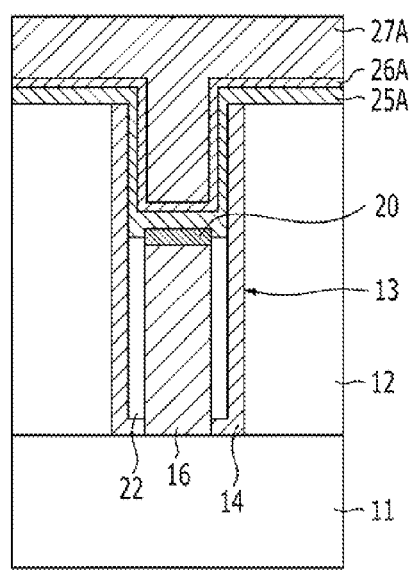
Figure 4C:
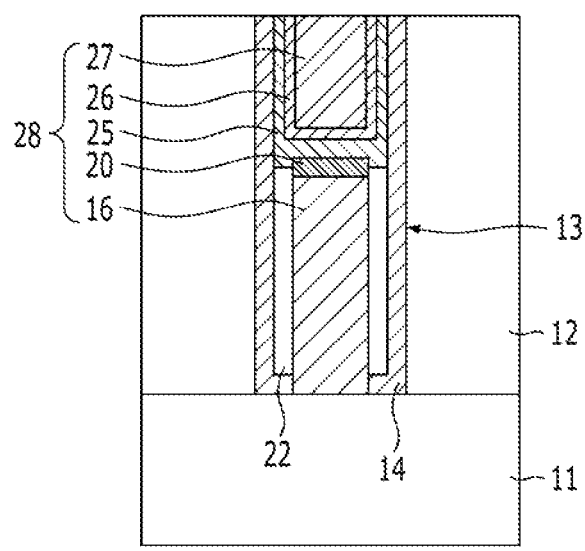

FIGS. 4A to 4C illustrate an exemplary method for capping an air gap.

Referring to FIG. 4A, a first barrier layer 25A is formed over the entire surface of the resulting structure including the air gap 22 and the ohmic contact layer 20. The first barrier layer 25A comprises a conductive material. The first barrier layer 25A is formed to cap the air gap 22. To cap the air gap 22 without filling the air gap 22 when the first barrier layer 25A is formed, a thickness of the first barrier layer 25A may be adjusted. For example, the first barrier layer 25A is formed to cap the air gap 22 without filling therein by using, for example, a physical vapor deposition (PVD) method. In particular, the first barrier layer 25A is formed over a top surface and a part of sidewalls of the ohmic contact layer 20. For this, a physical vapor deposition in an ionized metal plasma (PVD-IMP) method may be used. In general, when a thin layer is formed using a PVD method, a step coverage is deteriorated. That is, the thin layer is easily deposited on a flat surface but the thin layer is hard to deposit on sidewalls. Accordingly, when the PVD method is used, a step coverage is more deteriorated as an aspect ratio increases. On the contrary, when a thin layer is formed using a CVD method, the thin layer may be formed to have a uniform thickness at a top surface and sidewalls since a step coverage is excellent. By using the above described PVD method, the first barrier layer 25A is formed to cap the air gap 22 without filling the air gap 22. If the PVD method is a sputtering method, it is possible to form the first barrier layer 25A without filling the air gap 22, but is hard to stably cap the air gap 22.

Accordingly, by using the PVD-IMP method to form the first barrier layer 25A, the air gap 22 can be capped without filling the air gap 22. Further, through the PVD-IMP method, the linearity of the ionized metal is improved by ionizing a sputtered target metal, thereby improving a step coverage. The first barrier layer 25A may comprise a titanium-containing layer. The first barrier layer 25A may comprise a titanium layer. The titanium layer is formed by using the PVD-IMP method. (Hereinafter, the titanium layer formed by using the PVD-IMP method is referred to as PVD-IMP Ti.)

By using the PVD-IMP method, the first barrier layer 25A, which covers the top surface and the part of the sidewalls of the ohmic contact layer 20, is formed. As a result, since a contact area between the first barrier layer 25A and the ohmic contact layer 20 increases, a contact resistance is improved.

Subsequently, a second barrier layer 26A is formed over the first barrier layer 25A. The second barrier layer 26A may comprise a metal material. The second barrier layer 26A may comprise a titanium-containing layer. The second barrier layer 26A may comprise a titanium nitride (TiN) layer. The second barrier layer 26A may be formed by using a chemical vapor deposition (CVD) method. (Hereinafter, the TiN layer formed by using the CVD method is referred to as CVD TiN.) Accordingly, since the second barrier layer 26A has excellent step coverage, the second barrier layer 26A is formed to have a uniform thickness.

As described above, a barrier layer is formed by stacking the first barrier layer 25A and the second barrier layer 26A. The barrier layer is formed by stacking PVD-IMP Ti and CVD TiN.

Referring to FIG. 4B, a second conductive layer 27A is formed over the second barrier layer 26A. The second conductive layer 27A is formed to fill the open portion 13 over the second barrier layer 26A. The second conductive layer 27A may comprise a metal-containing layer. The second conductive layer 23A may comprise a tungsten layer.

Referring to FIG. 4C, a planarization process is performed on the first barrier layer 25A, the second barrier layer 26A, and the second conductive layer 27A. The planarization process may comprise an etch-back process, or a chemical mechanical polishing (CMP) process.

Through the planarization process, a first barrier pattern 25, a second barrier pattern 26, and a second conductive pattern 27 are formed. Thus, a conductive structure 28 which is formed in the open portion 13 comprises the first conductive pattern 16, the ohmic contact layer 20, the first barrier pattern 25, the second barrier pattern 26, and the second conductive pattern 27. The ohmic contact layer 20 forms an ohmic contact between the first conductive pattern 16 and the second conductive pattern 27. The first barrier pattern 25 and the second barrier pattern 26 prevent a mutual diffusion between the first conductive pattern 16 and the second conductive pattern 27.

The air gap 22 is formed between the first conductive pattern 16 and the sidewalls of the open portion 13. As a result, an insulation structure including air gap spacer 14 is formed between the conductive structure 28 and the sidewalls of the open portion 13.

The conductive structures 24 and 28 illustrated in FIGS. 3A-B and 4A-C may include a contact plug, an electrode, or the like. In case of the contact plug, the conductive structures 24 and 28 may include a stack structure of a silicon plug, an ohmic contact layer and a metal plug. Further, an air gap may be formed around the silicon plug. The conductive structures 24 and 28 may include a bit line, a metal interconnection, a gate electrode, a word line, or the like.

In accordance with the exemplary implementations described above, forming the air gap 22, an electrical insulating characteristic of the conductive structures 24 and 28 may be improved. That is, when another conductive pattern is disposed adjacent to the first conductive pattern 16, a parasitic capacitance between two conductive patterns is reduced.

Furthermore, by forming the ohmic contact layer 20 prior to the forming of the air gap 22, a space sufficient to form the second conductive patterns 23 and 26 may be secured. In addition, by enlarging an area to form the ohmic contact layer 20, a contact resistance may be improved.

Furthermore, since a contact area between the first barrier pattern 25 and the ohmic contact layer 20, the contact resistance may be more improved.

Figure 5A:
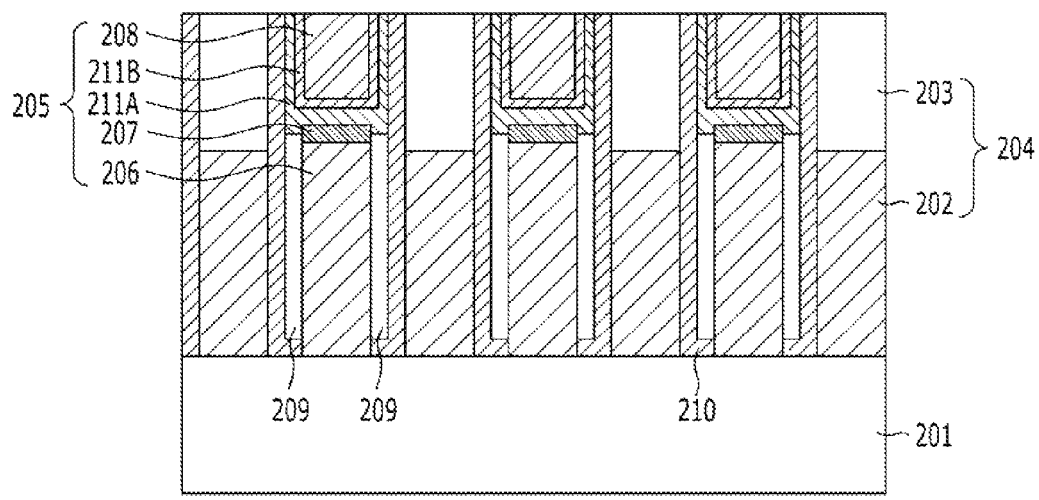
FIG. 5A is a cross sectional view illustrating an exemplary semiconductor device.

FIG. 5A is a cross sectional view illustrating an exemplary semiconductor device.

Referring to FIG. 5A, a plurality of conductive structures are formed over a substrate 201. The conductive structures comprise a first conductive structure 204 and a second conductive structure 205. An isolation structure having an air gap 209 is formed between the first conductive structure 204 and the second conductive structure 205. A spacer 210 is formed over sidewalls of the first conductive structure 204. The air gap 209 is formed between the spacer 210 and the second conductive structure 205. The first conductive structure 204 comprises a first conductive pattern 202 and an insulation pattern 203. The second conductive structure 205 comprises a second conductive pattern 206, an ohmic contact layer 207, a first barrier pattern 211A, a second barrier pattern 211B, and a third conductive pattern 208. The ohmic contact layer 207 and the air gap 209 are capped by the first barrier pattern 211A.

In detail, the substrate 201 comprises a silicon substrate, a silicon germanium substrate, or the like. Furthermore, the substrate 101 may include a silicon-on-insulator (SOI) substrate.

The first conductive structure 204 comprises the first conductive pattern 202. The first conductive structure 204 may comprise a stack structure of the first conductive pattern 202 and the insulation pattern 203. The first conductive pattern 202 may comprise a silicon-containing layer or a metal-containing layer. The first conductive pattern 202 may comprise a stack structure of a silicon-containing layer and a metal-containing layer. The first conductive pattern 202 may include polysilicon, metal, metal nitride, metal silicide, or the like. The first conductive pattern 202 may include a stack structure of a polysilicon layer and a metal layer. The first conductive pattern 202 may include tungsten. The insulation pattern 203 includes insulating materials. The insulation pattern 203 may include an oxide, a nitride, or the like.

The first conductive structure 204 and the second conductive structure 205 comprise a line type or a pillar type. Further, one of the first conductive structure 204 and the second conductive structure 205 may have a line type in which extends in one direction. The other of the first conductive structure 204 and the second conductive structure 205 may have a pillar type. For example, the first conductive structure 204 may be a structure having a line type, and the second conductive structure 205 may be a structure having a pillar type. The first conductive structures 204 may be regularly arranged on the substrate 201 at regular intervals.

One of the first conductive structure 204 and the second conductive structure 205 may include a gate structure or a bit line structure, and the other of the first conductive structure 204 or the second conductive structure 205 may include a contact plug. The contact plug may include a storage node contact plug, a landing plug, a metal contact plug, or the like. For example, the second conductive structure 205 may include a contact plug, and the second conductive structure 205 may include a stack structure including a silicon plug, an ohmic contact layer, and a metal plug.

The second conductive structure 205 comprises the second conductive pattern 206. The second conductive structure 205 may comprise a stack structure of the second conductive pattern 206, the ohmic contact layer 207, the first barrier pattern 211A, the second barrier pattern 211B, and the third conductive pattern 208. The second conductive pattern 206 may include a silicon-containing layer, and the third conductive pattern 208 may include a metal-containing layer. The third conductive pattern 208 may include a metal, a metal silicide, a metal nitride, or the like. The ohmic contact layer 207 is formed between the first conductive pattern 206 and the second conductive pattern 208, and the first and second barrier patterns 211A and 211B are formed over the ohmic contact layer 207. The ohmic contact layer 207 may include metal silicide, such as cobalt silicide with a $CoSi_2$ phase. The second conductive pattern 206 has a height substantially the same as or greater than that of the first conductive pattern 202. An open portion (not shown) is defined between adjacent first conductive structures 204, and the second conductive structure 205 may be formed in the open portion. The open portion may expose sidewalls of the first conductive structure 204.

The first barrier pattern 211A is formed over a top surface and a part of sidewalls of the ohmic contact layer 207 to cap the air gap 209. Further, the first barrier pattern 211A is formed over the air gap 209 to cover sidewalls defining the open portion. A portion of the first barrier pattern 211A that is formed over the top surface and the part of the sidewalls of the ohmic contact layer 207 has a first thickness T1. A portion of the first barrier pattern 211A that is formed over the air gap 209 on the sidewalls that define the open portion 103 has a second thickness T2. The second thickness T2 is less than the first thickness T1. A physical vapor deposition in an ionized metal plasma (PVD-IMP) method may be used to make a difference between the first thickness T1 and the second thickness T2. Accordingly, the first barrier pattern 211A may block the entrance of the air gap cap 209 without filling the air gap 209. The first barrier pattern 211A may comprise a titanium-containing layer. The first barrier pattern 211A may comprise a titanium layer. The titanium layer may be formed by using the PVD-IMP method. (Hereinafter, the titanium layer formed by using the PVD-IMP method is referred to as PVD-IMP Ti.) By using the PVD-IMP method, the first barrier pattern 211A, which covers the top surface and the part of the sidewalls of the ohmic contact layer 207, is formed. As a result, since a contact area between the first barrier pattern 211A and the ohmic contact layer 207 increases, a contact resistance is improved.

The second barrier pattern 211B comprises a titanium-containing layer. The second barrier pattern 211B may comprise a titanium nitride (TiN) layer. The TiN layer may be formed by using chemical vapor deposition (CVD) method. (Hereinafter, the TiN layer formed by using the CVD method is referred to as CVD TiN.) Accordingly, since the second barrier pattern 211B has excellent step coverage, the second barrier pattern 211B is formed to have a uniform thickness.

As described above, a barrier pattern is formed by stacking the first barrier pattern 211A of PVD-IMP Ti and the second barrier pattern 211B of CVD TiN. In an alternative implementation, the barrier pattern may be formed, using a PVD-IMP method, to have a single layer of PVD-IMP Ti.

The spacer 210 is formed over the sidewalls of the first conductive structure 204. The spacer 210 comprises a material having a low dielectric constant. The low dielectric constant materials include an oxide or a nitride. The spacer 210 may include a silicon oxide, a silicon nitride, or a metal oxide.

The air gap 209 is formed by removing a sacrificial material that is formed between the spacer 210 and the second conductive pattern 206. After forming the ohmic contact layer 207, the air gap 209 is formed by removing the sacrificial materials.

In FIG. 5A, the air gap 209 is stably capped by the first barrier pattern 211A. Due to the air gap 209, a parasitic capacitance between the first and second conductive patterns 204 and 205 is reduced.

Furthermore, by forming the ohmic contact layer 207 prior to the air gap 209, a space sufficient to form the third conductive pattern 208 may be secured. In addition, by enlarging an area to form the ohmic contact layer 207, a contact resistance may be improved.

Figure 5B:
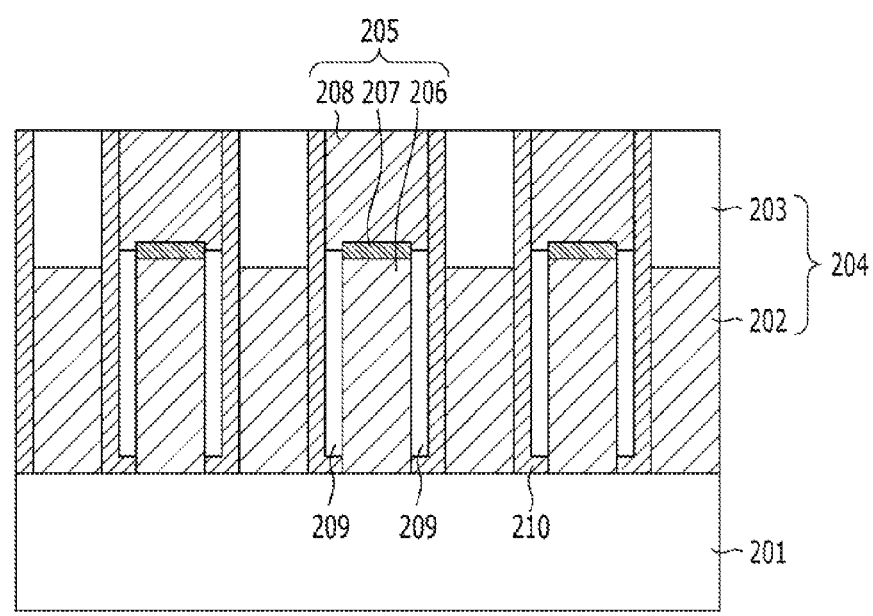
FIG. 5B is a cross sectional view illustrating modification of an exemplary semiconductor device shown in FIG. 5A.

FIG. 5B is a cross sectional view illustrating a modification of the exemplary semiconductor device of FIG. 5A.

Referring to FIG. 5B, the air gap 209 and the ohmic contact layer 207 are capped by using the third conductive pattern 208 without the barrier pattern of the first barrier pattern 211A and the second barrier pattern 211B, different from FIG. 5A.

FIGS. 6A to 6J are cross sectional views illustrating an exemplary method for fabricating an exemplary semiconductor device of FIGS. 5A and 5B.

Figure 6A:
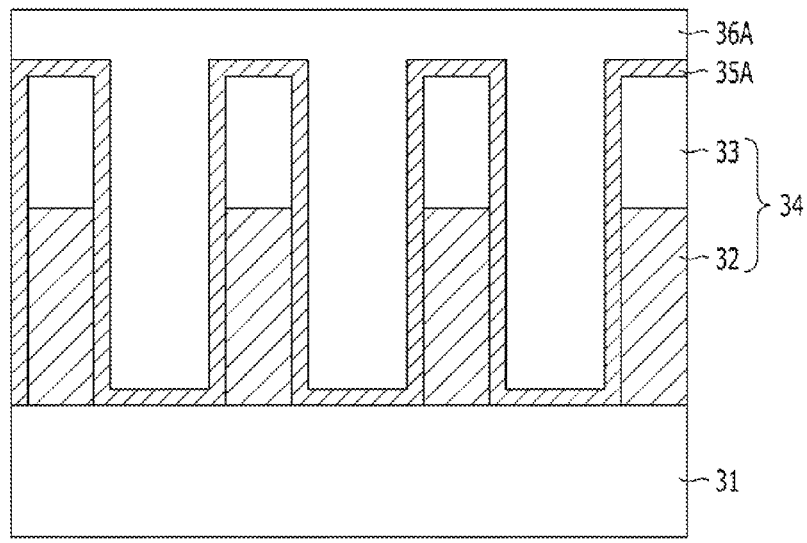
FIGS. 6A to 6J are cross sectional views illustrating an exemplary method for fabricating an exemplary semiconductor device of FIGS. 5A and 5B.

Referring to FIG. 6A, a plurality of first conductive structures 34 are formed over a substrate 31. The substrate 31 comprises a semiconductor substrate. The substrate 31 may include a silicon substrate, a silicon germanium substrate, or the like. Furthermore, the substrate 31 may include a silicon-on-insulator (SOI) substrate.

The first conductive structures 34 formed over the substrate 31 are regularly arranged at a certain interval. To form first conductive structures 34, a hard mask pattern 33 is formed over a first conductive layer (not shown), and the first conductive layer is etched using the hard mask pattern 33 as an etch barrier to form a first conductive pattern 32. As a result, the first conductive structures 34 are formed to have a stack structure of the first conductive pattern 32 and the hard mask pattern 33.

The first conductive pattern 32 may comprise a silicon-containing layer or a metal-containing layer. For example, the first conductive pattern 32 may include polysilicon or tungsten. The first conductive pattern 32 may include a stack structure of a silicon-containing layer and a metal-containing layer. For example, the first conductive pattern 32 may include a stack structure of a polysilicon layer and a tungsten layer. At this time, a barrier layer may be formed between the polysilicon layer and the tungsten layer. The first conductive pattern 32 may include a stack structure of a polysilicon layer, a titanium-containing layer, and a tungsten layer. The titanium-containing layer is used as a barrier layer, and may include a stack structure of a titanium layer and a titanium nitride layer. The hard mask pattern 33 may comprise an insulating material.

A first insulation layer 35A is formed over the first conductive structures 34. The first insulation layer 35A comprises low-k materials. The first insulation layer 35A may include an oxide, a nitride, or the like. For example, the first insulating layer 35A may include a silicon nitride, a silicon oxide, or the like. The first insulation layer 35A is conformally formed over the entire surface of the resulting structure including the first conductive structures 34. The first insulation layer 35A includes a material serving as a spacer.

A second insulation layer 36A is formed over the first insulation layer 35A. The second insulation layer 36A may comprise silicon oxide. The second insulation layer 36A may be formed over the first insulation layer 35A to fill spaces between the first conductive structures 34. The second insulation layer 36A may include a material that can serve as an inter-layer insulation layer.

Figure 6B:
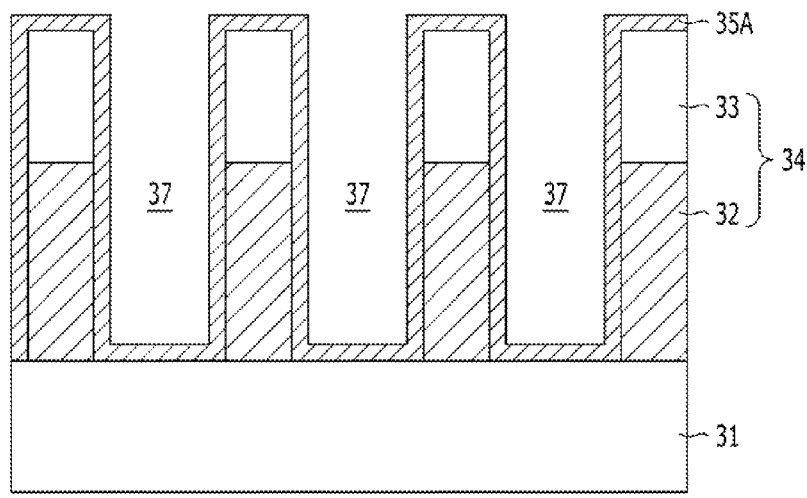

Referring to FIG. 6B, a planarization process is performed on the second insulation layer 36A to expose a surface of the first insulation layer 35A.

The second insulation layer 36A is etched to form an open portion 37. After forming the open portion 37, the second insulation layer 36A may be removed. A mask pattern (not shown) may be used to form the open portion 37. The open portion 37 has a hole shape or a line shape. For example, the open portion 13 may be formed between the first conductive structures 34. The first insulation layer 35A may be exposed at sidewalls defining the open portion 37. To form the open portion 37, the second insulation layer 36A may be etched to be arranged with the first conductive structures 34 and the first insulation layer 35A.

The first insulation layer 35A may remain on the substrate 31 below the open portion 37.

Figure 6C:
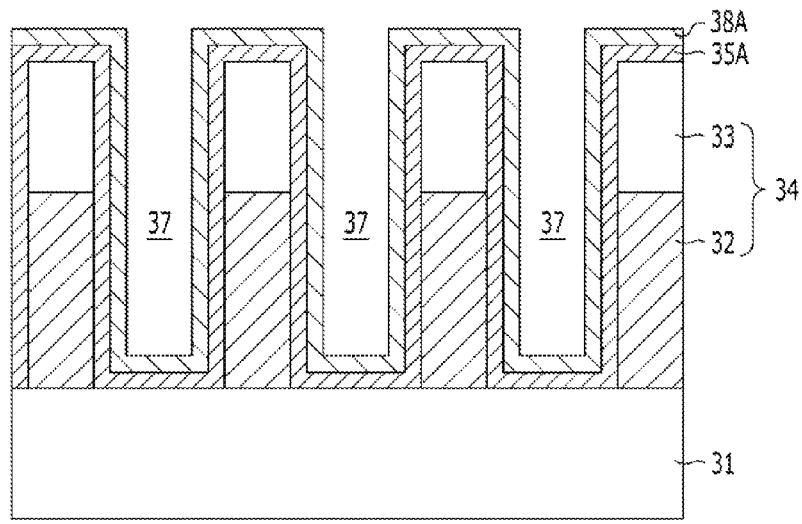

Referring to FIG. 6C, a sacrificial layer 38A is formed over the entire surface of the resulting structure, including in the open portion 37. The sacrificial layer 38A is conformally formed over the first insulation layer 35A. The sacrificial layer 38A includes a material to be etched during a subsequent process to form an air gap. The material for the sacrificial layer 38A may include, for example, titanium nitride (TiN).

In an alternative implementation, after forming the open portion 37, the first insulation layer 35A and the sacrificial layer 38A may be sequentially formed. Accordingly, the first insulation layer 35A and the sacrificial layer 38A may be formed to cover an exposed surface of the substrate 31, the sidewalls of the open portion 37, and a top surface of the hard mask pattern 33.

Figure 6D:
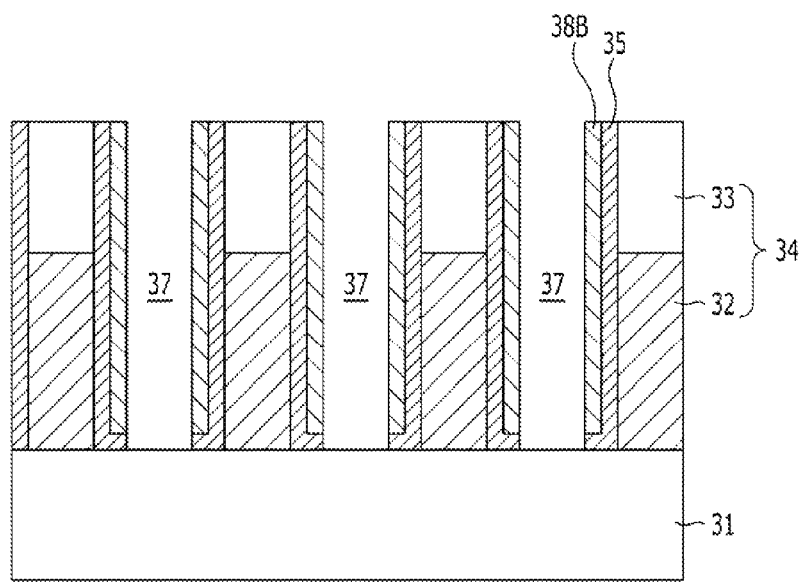

Referring to FIG. 6D, a sacrificial spacer 38B is formed. The sacrificial spacer 38B is formed by selectively etching the sacrificial layer 38A. A dry etch process may be used to form the sacrificial spacer 38B. The dry etch process may include an etch-back process. Thus, the sacrificial spacer 38B is formed adjacent to sidewalls of the first conductive structures 34.

At this time, the first insulation layer 35A formed over the exposed surface of the substrate 31 and the top surface of the hard mask pattern 33 is selectively etched. A spacer 35 is formed by selectively etching the first insulation layer 35A. The spacer 35 is formed over the sidewalls of the first conductive structures 34. The sacrificial spacer 38B remains on sidewalls of the spacer 35. A dry etch process may be used to form the spacer 35. The dry etch process may include an etch-back process. By forming the spacer 35, a part of the substrate is exposed. The sacrificial spacer 38B is separated from the substrate 31 a lower portion of the spacer 35.

As describe above, a dual spacer structure of the spacer 35 and the sacrificial spacer 38B is formed over the sidewalls of the first conductive structures 34. The dual spacer structure may be formed over the sidewalls defining the open portion 37. The open portion 37 may have a line type or a hole type.

Figure 6E:
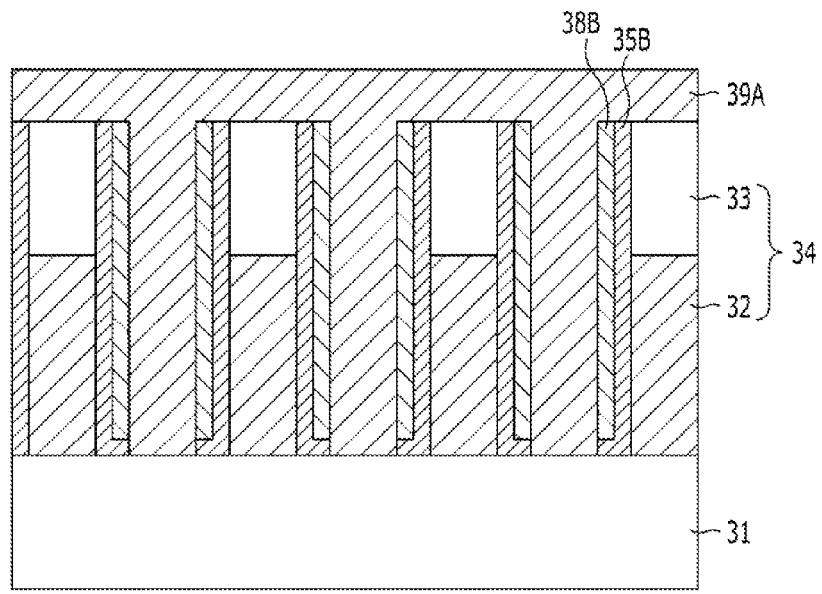

Referring to FIG. 6E, a second conductive layer 39A is formed to fill the open portion 37. The second conductive layer 39A may include a silicon-containing layer. The second conductive layer 39A may include a polysilicon layer.

Figure 6F:
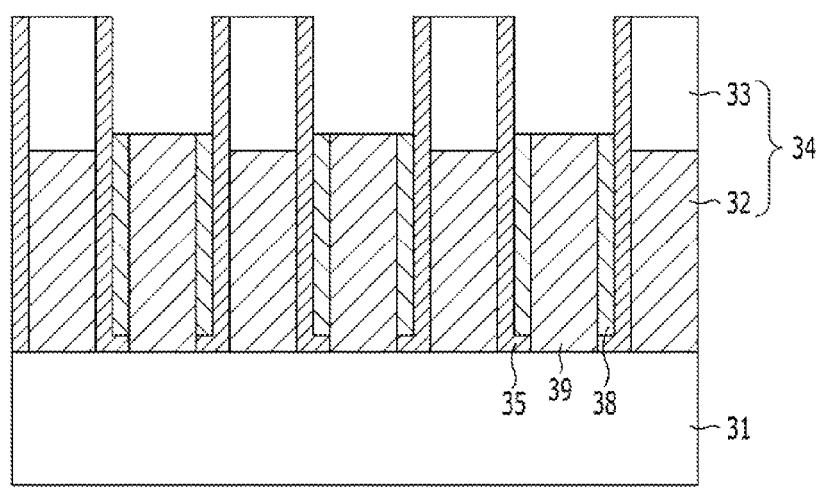

Referring to FIG. 6F, the second conductive layer 39A is selectively etched to form a second conductive pattern 39. The second conductive pattern 39 is formed to fill a part of the open portion 37. In other words, the second conductive pattern 39 is formed to be recessed in the open portion 37. The second conductive pattern 39 is formed by performing a planarization process and a recessing process on the second conductive layer 39A. An etch-back process or a chemical mechanical polishing (CMP) process is performed to the second conductive pattern 39. The second conductive pattern 39 has a recessed surface lower than top surfaces of the first conductive structures 34. The recessed surface of the second conductive pattern 39 is adjusted to have a height higher than a top surface of the first conductive pattern 32. The height of the recessed surface of the second conductive pattern 39 is adjusted to minimize a facing area to the first conductive pattern 32. Accordingly, parasitic capacitance between the first conductive pattern 32 and the second conductive pattern 39 may be reduced.

A part of the sacrificial spacer 38B is exposed after the second conductive pattern 39 is recessed.

Next, the sacrificial spacer 38B is recessed to form a sacrificial spacer 38. The sacrificial spacer 38B is selectively etched to form the sacrificial spacer 38. The part of the sacrificial spacer 38B that is exposed after the second conductive pattern 39 is recessed is recessed in a certain depth. An etch-back process may be applied to recess the sacrificial spacer 38B.

As described above, a recessed structure is formed in the open portion 37. The recessed structure Includes the second conductive pattern 39 and the sacrificial spacer 38.

Figure 6G:
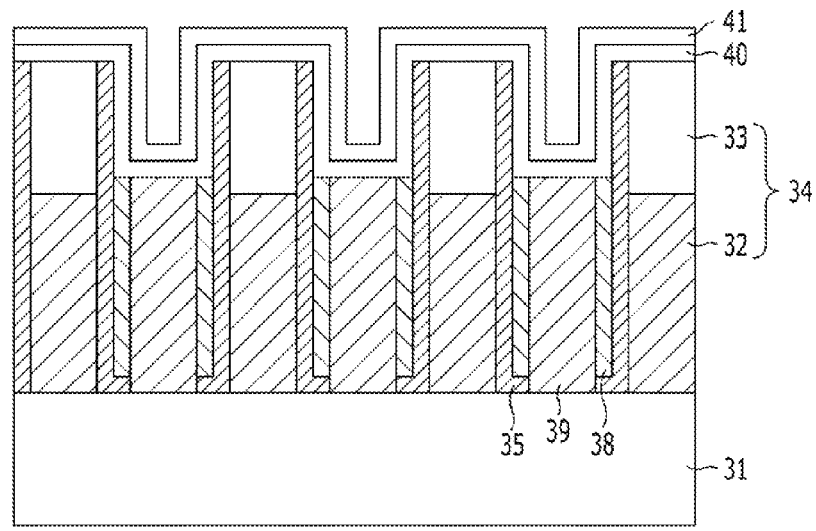

Referring to FIG. 6G, a silicidable layer 40 is formed over the entire surface of the resulting structure, including the recessed structure. The silicidable layer 40 is conformally formed over the entire surface of the resulting structure, including the recess structure. The silicidable layer 40 comprises a material that will form a metal silicide through a silicidation reaction with the second conductive pattern 39. The silicidable layer 40 may comprise a silicidable metal layer. The silicidable metal layer may include a metal-containing layer comprising metal atoms, such as cobalt. If the second conductive pattern 39 comprises polysilicon, then the silicidable layer 40 may comprise cobalt.

A protection layer 41 is formed over the silicidable layer 40. The protection layer 41 is conformally formed over the silicidable layer 40. The protection layer 41 prevents an attack of a silicide layer during a subsequent silicidation process. The protection layer 41 may comprises metal nitride. The protection layer 41 may comprise a titanium-containing layer. The protection layer 41 may comprise titanium nitride. The protection layer 41 may be formed by stacking titanium and titanium nitride.

Figure 6H:
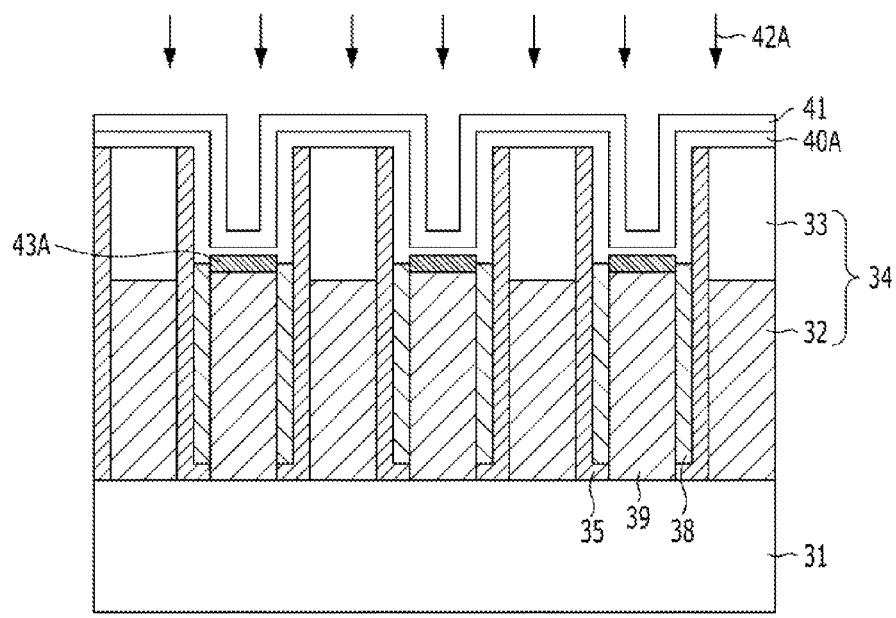

Referring to FIG. 6H, a first annealing process 42A is performed. At this time, since the silicidation reaction occurs due to the first annealing process 42A, the second conductive pattern 39 reacts with the silicidable layer 40 to form an ohmic contact layer 43A. In other words, the silicidation reaction occurs at an interface between the second conductive pattern 39 and the silicidable layer 40, thereby forming the ohmic contact layer 43A comprising a metal silicide layer. The first annealing process 42A may be performed at a temperature above at least 200° C. to occur the silicidation reaction between the second conductive pattern 39 and the silicidable layer 40. The first annealing process 42A comprises a rapid thermal annealing (RTA) process. Through the first annealing process 42A, silicon of the second conductive pattern 39 react with metal of the silicidable layer 40 to form the ohmic contact layer 43A. The ohmic contact layer 43A may include metal silicide. The ohmic contact layer 43A may include cobalt silicide. In this implementation, the ohmic contact layer 43A may include cobalt silicide with a $CoSi_x$ phase. Preferably, the first annealing process 42A is performed at a temperature ranging from approximately 400° C. to approximately 600° C. Through the first annealing process 42A, the ohmic contact layer 43A of cobalt silicide is formed to have a $CoSi_x$ phase, x being from about 0.1 to about 1.5.

After forming the ohmic contact layer 43A, any unreacted silicidable layer 40A may be removed by a strip process 44, as described below.

Figure 6I:
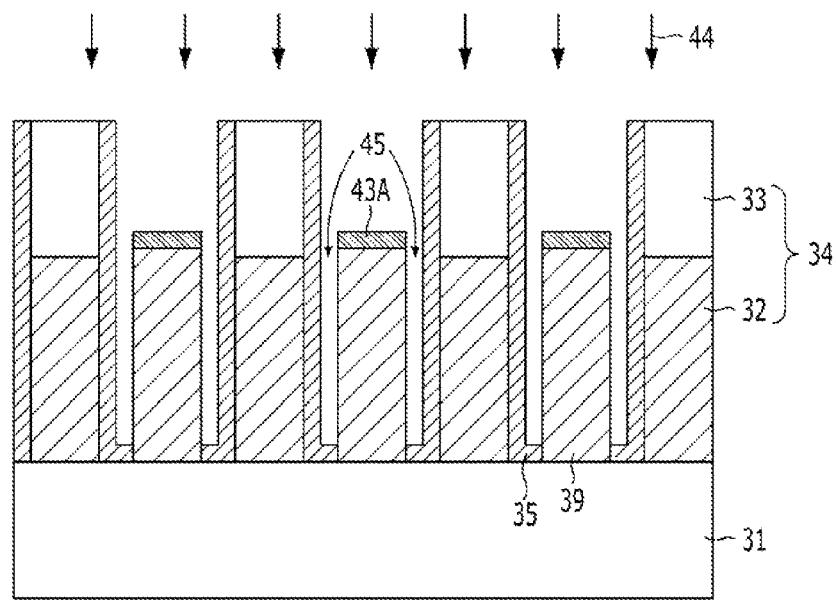

Referring to FIG. 6I, a strip process 44 is performed to remove the protection layer 41 and any unreacted silicidable layer 40A. The strip process 44 may be performed through a clean process using a wet chemical. For example, the clean process may be performed using chemicals based on $H_2SO_4$ (SPM) or $NH_4OH$ (SC-1). Since the protection layer 41 and the sacrificial spacer 38 comprise titanium nitride, the sacrificial spacer 38 is also removed by the strip process 44. As a result, the protection layer 41, the unreacted silicidable layer 40A, and the sacrificial spacer 38 are removed by using one strip process. Accordingly, a loss of surrounding structures may be minimized, and the process may be simplified.

As described above, the sacrificial spacer 38 is removed by the strip process 44. A space left by the removal of the sacrificial spacer 38 forms an air gap 45. Since the air gap 45 is formed at the same time as the strip process 44 is performed, a loss of the air gap 45 does not occur.

The air gap 45 is formed between the first conductive pattern 32 and the second conductive pattern 39, and an insulation structure including an air gap spacer 35 is formed between the first conductive pattern 32 and the second conductive pattern 39.

Figure 6J:
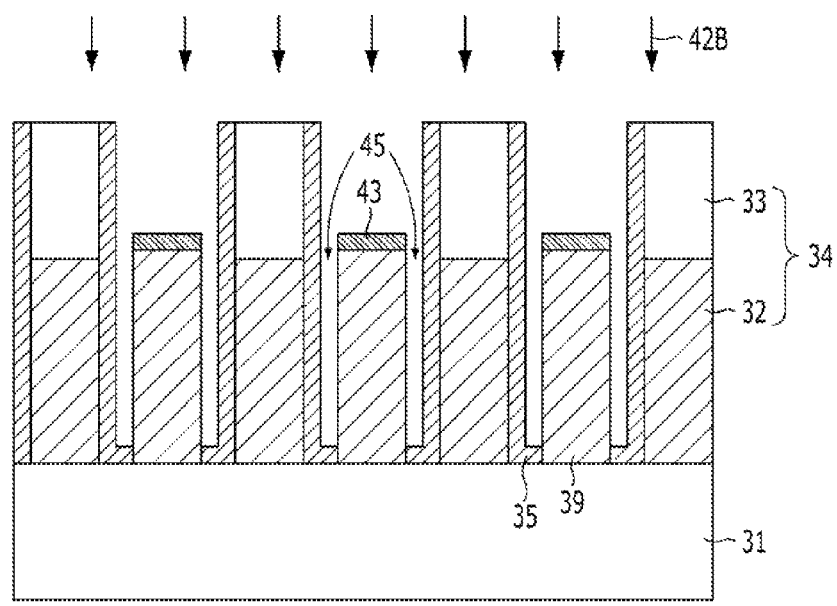

Referring to FIG. 6J, a second annealing process 42B is performed. The second annealing process 42B may comprise a rapid thermal annealing (RTA) process. The second annealing process 42B may be performed at a temperature greater than a temperature of the first annealing process 42A. The second annealing process 42B is performed at a temperature ranging from approximately 600° C. to approximately 800° C. The ohmic contact layer 43A is phase changed by the second annealing process 426. A phase-changed ohmic contact layer is represented by reference numeral 43. In other words, through the first annealing process 42A, the ohmic contact layer 43A of cobalt silicide having a $CoSi_x$ phase (x being from about 0.1 to about 1.5) is formed. Through the second annealing process 42B, the ohmic contact layer 43A of cobalt silicide having the $CoSi_x$ phase (x=about 0.1~about 1.5) is changed into the ohmic contact layer 43 of cobalt silicide having a $CoSi_2$ phase. For reference, from among cobalt silicides, cobalt silicide having a $CoSi_2$ phase has the lowest resistivity.

Since the cobalt silicide having the $CoSi_2$ phase is used as the ohmic contact layer 43, contact resistance may be improved and cobalt silicide having sufficient low resistance even in the small area of the open portion 37 having a fine line width may also be formed.

Figure 7:
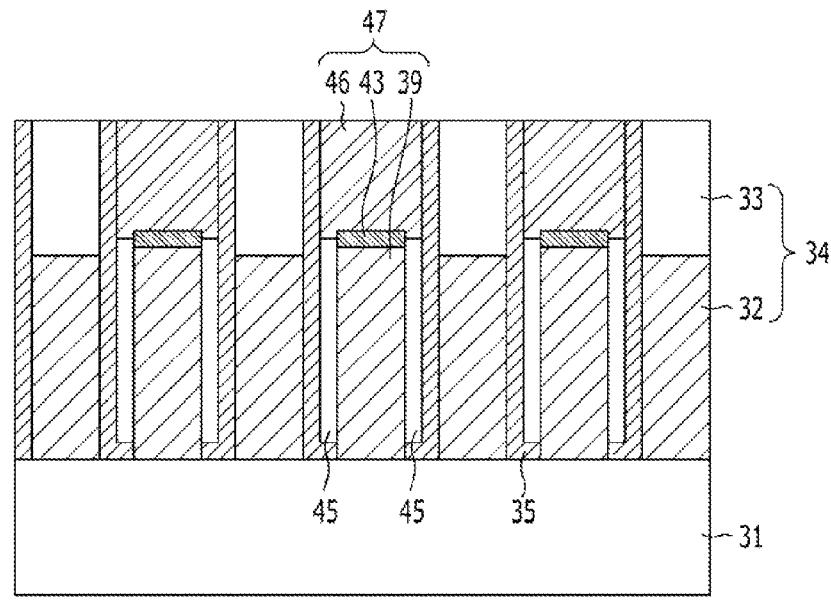
FIG. 7 illustrates an exemplary method for capping an air.

FIG. 7 illustrates an exemplary method for capping an air gap.

Referring to FIG. 7, a third conductive pattern 46 is formed over the entire surface of the resulting structure including the air gap 45 and the ohmic contact layer 43. The third conductive pattern 46 is formed to cap the air gap 45. In this case, the third conductive pattern 46 may block the entrance of the air gap 45 without filling the air gap 45, since a space of the air gap 45 is narrow. The third conductive pattern 46 is formed over the ohmic contact layer 43 to fill the open portion 37, without filling the air gap 45. Further, the third conductive pattern 46 may be formed to cover a part of sidewalls of the ohmic contact layer 43. The third conductive pattern 46 may comprise a metal-containing layer. The third conductive pattern 46 may comprise a tungsten layer.

To form the third conductive pattern 46, a planarization process is performed on a third conductive layer (not shown) after the third conductive layer is formed to fill the open portion 37. The planarization process may comprise an etch-back process, or a chemical mechanical polishing (CMP) process.

Accordingly, a second conductive structure 47 which is formed in the open portion 37 comprises the second conductive pattern 39, the ohmic contact layer 43, and the third conductive pattern 46. The ohmic contact layer 43 forms an ohmic contact between the second conductive pattern 39 and the third conductive pattern 46. The air gap 45 is formed over the sidewalls of the second conductive pattern 39. As a result, an insulation structure including air gap spacer 35 is formed between the first conductive structure 34 and the second conductive structure 47.

Figure 8:
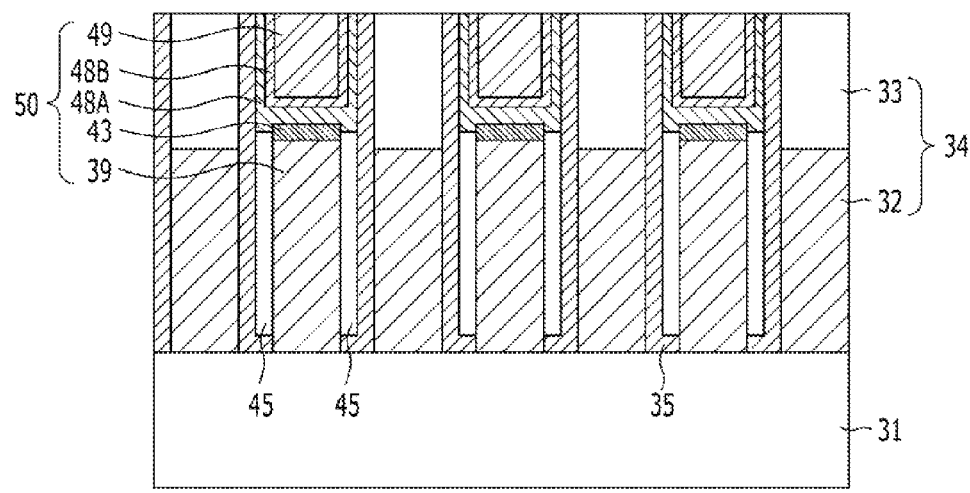
FIG. 8 illustrates an exemplary method for capping an air gap.

FIG. 8 illustrates an exemplary method for capping an air gap.

Referring to FIG. 8, a first barrier pattern 48A, a second barrier pattern 48B, and a third conductive pattern 49 are formed over the ohmic contact layer 43. Thus, a second conductive structure 50, which is formed in the open portion 37, comprises the second conductive pattern 39, the ohmic contact layer 43, the first barrier pattern 48A, the second barrier pattern 48B, and the third conductive pattern 49. The ohmic contact layer 43 forms an ohmic contact between the second conductive pattern 39 and the third conductive pattern 49. The first barrier pattern 48A and the second barrier pattern 48B prevent a mutual diffusion between the second conductive pattern 39 and the third conductive pattern 49.

The air gap 45 is formed between sidewalls of the second conductive pattern 39. As a result, an insulation structure including an air gap spacer 35 is formed between the first conductive structure 34 and the second conductive structure 50.

The first barrier pattern 48A is formed to cap the air gap 45 without filling the air gap 45 by using a physical vapor deposition in an ionized metal plasma (PVD-IMP) method. Through the PVD-IMP method, the linearity of the ionized metal is improved by ionizing a sputtered target metal, thereby improving a step coverage. The first barrier pattern 48A comprises a titanium-containing layer. The first barrier pattern 48A may comprise a titanium layer. The titanium layer may be formed by using the PVD-IMP method. (Hereinafter, the titanium layer formed by using the PVD-IMP method is referred to as PVD-IMP Ti.) By using the PVD-IMP method, the first barrier pattern 48A, which covers a top surface and a part of the sidewalls of the ohmic contact layer 43, is formed. As a result, since a contact area between the first barrier pattern 48A and the ohmic contact layer 43 increases, a contact resistance is improved.

Subsequently, a second barrier pattern 48B is formed over the first barrier pattern 48A. The second barrier pattern 48B may comprise a titanium-containing layer. The second barrier pattern 48B may comprise a titanium nitride (TiN) layer. The second barrier pattern 48B is formed by using a chemical vapor deposition (CVD) method. (Hereinafter, the TiN layer formed by using the CVD method is referred to as CVD TiN.) Accordingly, since the second barrier pattern 48B has excellent step coverage, the second barrier pattern 48B is formed to have a uniform thickness.

As described above, a barrier layer is formed by stacking the first barrier pattern 48A and the second barrier pattern 48B. The barrier layer is formed by stacking PVD-IMP Ti and CVD TiN.

The second conductive structures 47 and 50, illustrated in FIGS. 7 and 8 may include a contact plug, an electrode, a storage node contact plug, or the like. In case of the storage node contact plug, the second conductive structures 47 and 50 may include a stack structure of a silicon plug, an ohmic contact layer and a metal plug. Further, the air gap 45 may be formed around the silicon plug. The second conductive structures 47 and 50 may include a bit line, a metal interconnection, a gate electrode, a word line, or the like.

By forming the air gap 45, a parasitic capacitance between the first conductive structure 34, and the second conductive structures 47 and 50 is reduced.

Furthermore, by forming the ohmic contact layer 43 prior to the forming of the air gap 45, a space sufficient to form the third conductive patterns 46 and 49 may be secured. In addition, by enlarging an area to form the ohmic contact layer 43, a contact resistance may be improved.

Furthermore, since a contact area between the first barrier pattern 48A and the ohmic contact layer 43, the contact resistance may be more improved.

FIGS. 9A to 9D illustrate a comparative example.

Figure 9A:
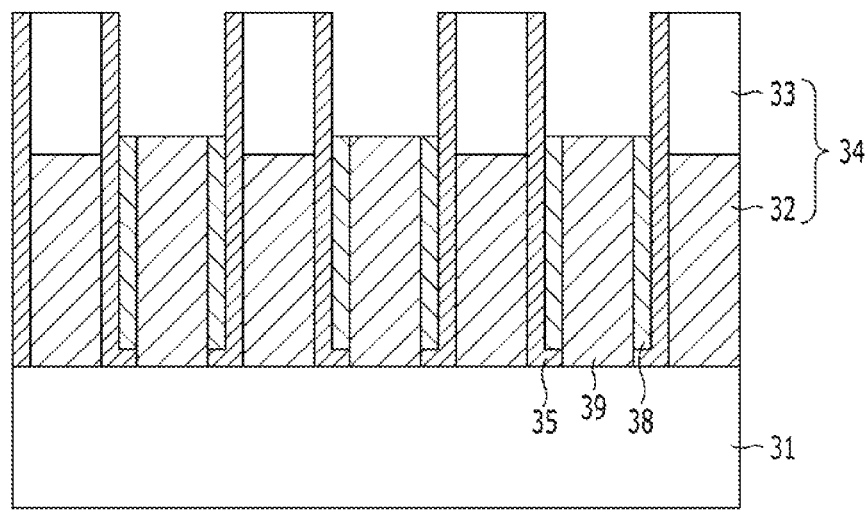
FIGS. 9A to 9D illustrate a comparative example.

Referring to FIG. 9A, a plurality of first conductive structures 34 are formed over a substrate. Each of the first conductive structures 34 includes a first conductive pattern 32 and a hard mask pattern 33.

After forming an open portion (not shown) is formed between the first conductive structures 34, a spacer 35 is formed over sidewalls of the first conductive structures 34.

Subsequently, a recessed second conductive pattern 39 and a recessed sacrificial spacer 38 are formed.

Figure 9B:
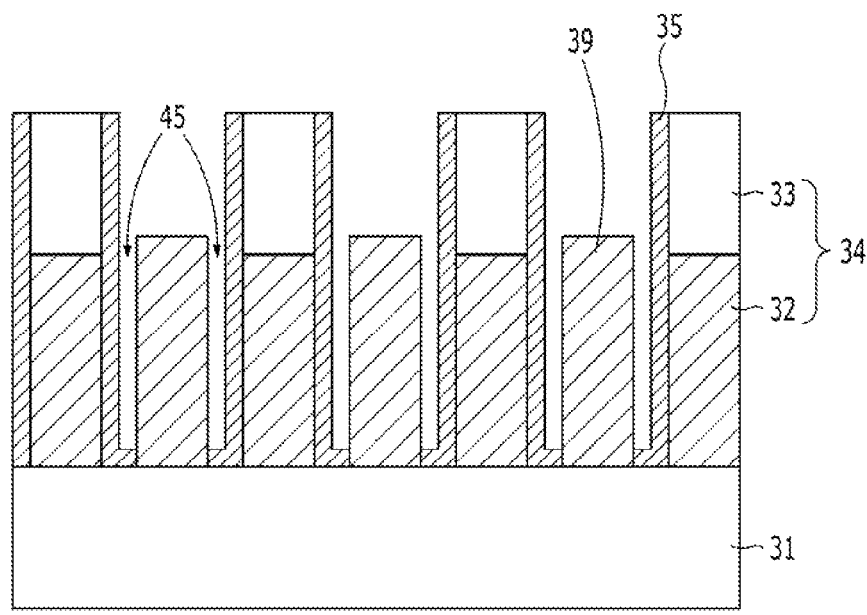

Referring to FIG. 9B, an air gap 45 is formed by removing the recessed sacrificial spacer 38.

Figure 9C:
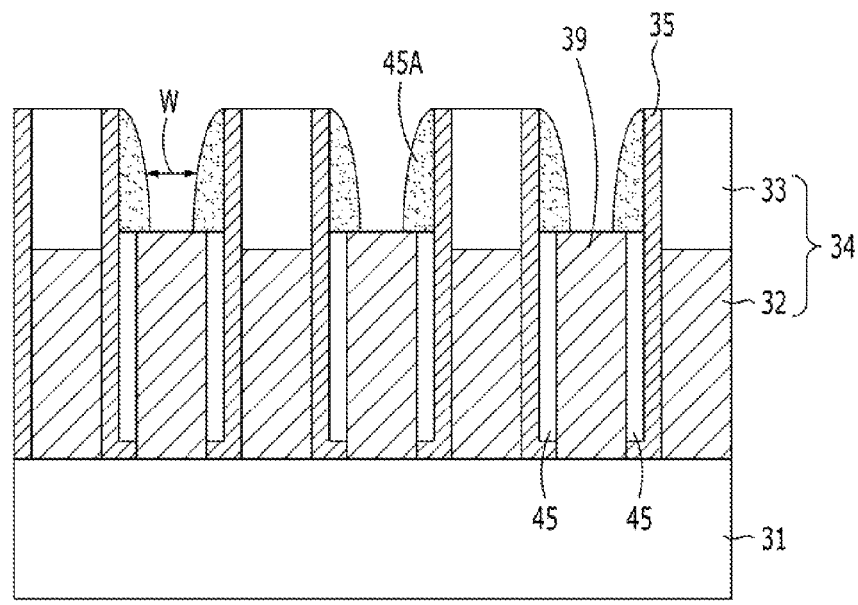

Referring to FIG. 9C, a capping spacer 45A is formed to cap the air cap 45.

Figure 9D:
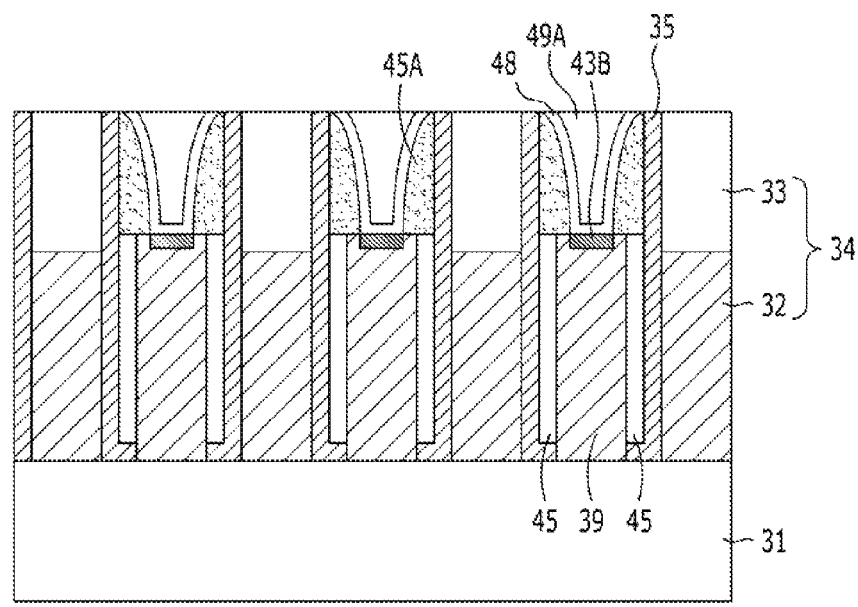

Referring to FIG. 9D, an ohmic contact layer 43B, a barrier pattern 48, and a third conductive pattern 49A are formed over the recessed second conductive pattern 39.

In the comparative example, the sacrificial spacer 38 may be formed of silicon oxide, silicon nitride, titanium nitride, or the like. To form the air gap 45, a wet etch process is applied to remove the sacrificial spacer 38.

However, in the comparative example, if a thickness of the capping spacer 45A increases in order to stably cap the air gap 45, a space W for the third conductive pattern 49A and a formation area for the ohmic contact layer 43B become significantly reduced. As a result, contact resistance may considerably increase.

In particular, in the comparative example, if the thickness of the capping spacer 45A decreases, then the air gap 45 is opened while the capping spacer 45A is formed.

Furthermore, in the comparative example, due to a strip process and a clean process subsequent to a process for forming the ohmic contact layer 43B and the third conductive pattern 49A, the capping spacer 45A is attacked and lost, thereby exposing the air gap 45. Accordingly, the barrier pattern 48 and the third conductive pattern 49A flows into the air gap 45 to fill the air gap.

In the comparative example, surrounding structures are attacked and lost due to a strip process for removing the sacrificial spacer 38 to form the air gap 45, and a strip process for removing unreacted-residue layers and protection layers.

In the implementations of the present invention, however, since the ohmic contact layer 43A is formed in advance, and the air gap 45 is formed, a formation area for the ohmic contact layer 43A becomes reduced. As a result, contact resistance may increase. Further, since the air gap 45 is capped using the first barrier pattern 48A, a space sufficient to form the third conductive pattern 49 may be secured. As a result, by enlarging an area to form the ohmic contact layer 43A, a contact resistance may be improved. In addition, the air gap 45 is formed using one strip process 44, and capped by the first barrier pattern 48A. Accordingly, by reducing the number of the strip processes, a loss of surrounding structures may be minimized.

Figure 10A:
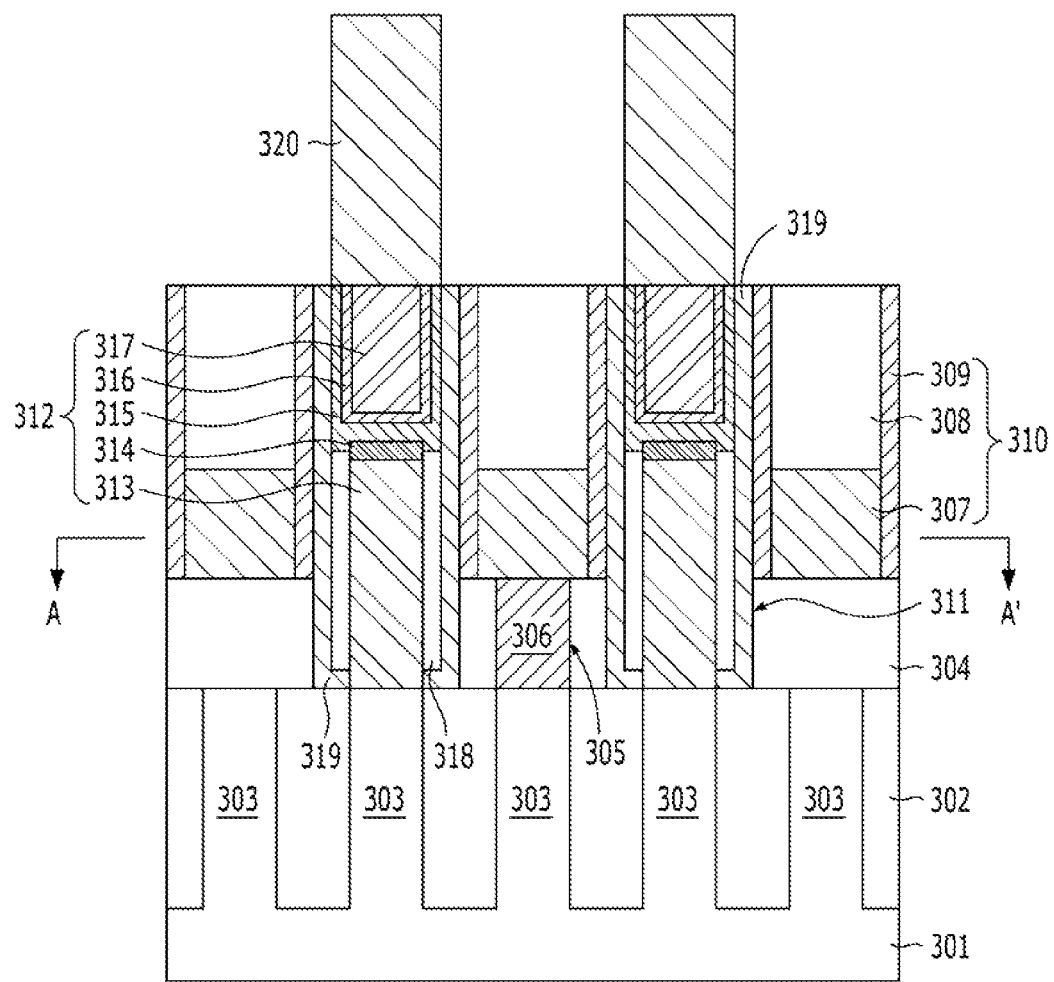
FIG. 10A illustrates exemplary memory cells of a semiconductor device.
Figure 10B:
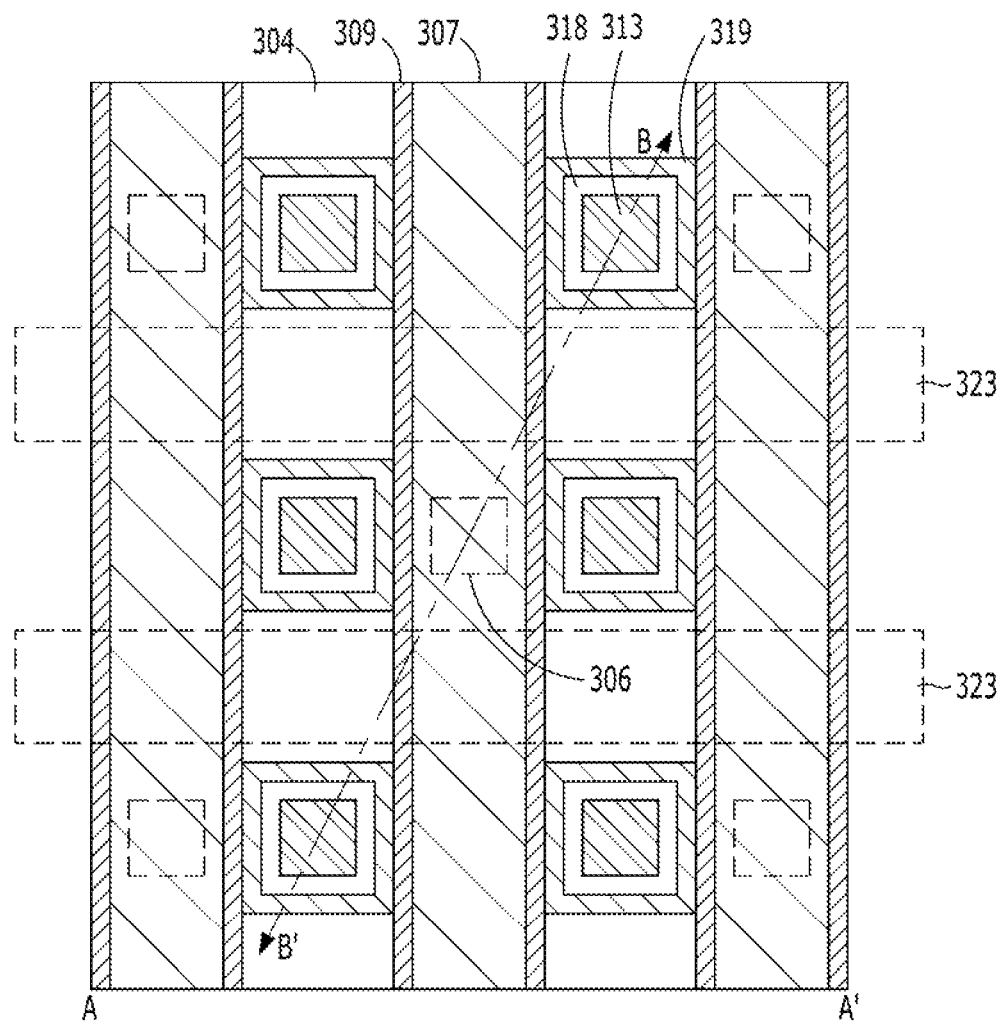
FIG. 10B is a cross-sectional view of the exemplary memory cells taken along line A-A' of FIG. 10A.
Figure 10C:
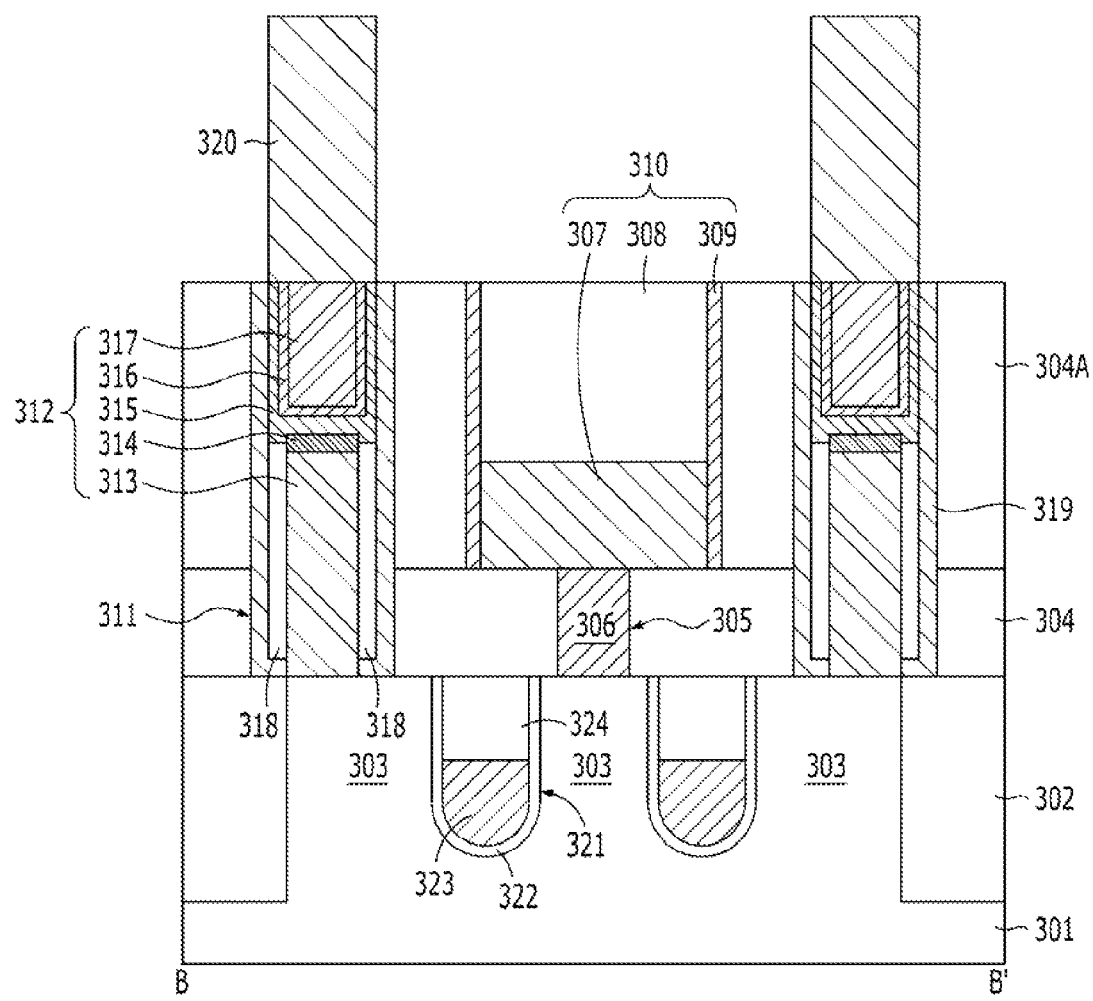
FIG. 10C is a cross-sectional view of the exemplary memory cells taken along line B-B' of FIG. 10A.

FIG. 10A illustrates exemplary memory cells of a semiconductor device implementation. FIG. 10B is a cross-sectional view of the memory cells taken along line A-A' of FIG. 10A. FIG. 10C is a cross-sectional view of the memory cells taken along line B-B' of FIG. 10A.

For reference, the memory cells shown in FIG. 10A may include DRAM memory cells.

Referring to FIGS. 10A to 10C, an active region 303 is defined by a device isolation region 302 in a substrate 301. As shown in FIG. 10C, a gate trench 321 is formed across the active region 303. A gate dielectric layer 322 is formed along a surface of the gate trench 321. A buried gate electrode 323 is formed over the gate dielectric layer 322 to partially fill the gate trench 321. Though not illustrated, source/drain regions are formed in the substrate 301. A sealing layer 324 is formed over the buried gate electrode 323. A bit line structure 310, including a bit line 307 extending in a direction crossing the buried gate electrode 323, is formed.

The bit line structure 310 comprises the bit line 307, a bit line hard mask 308, and a bit line spacer 309. The bit line 307 is coupled to the active region 303 via a bit line contact plug 306. The bit line contact plug 306 is formed in a bit line contact hole 305 that is formed in a first inter-layer insulation layer 304.

A storage node contact plug 312 coupled to the active region 303 is formed. The storage node contact plug 312 is formed in a storage node contact hole 311 that penetrates the first inter-layer insulation layer 304 and a second inter-layer insulation layer 304A. The storage node contact plug 312 may comprise a first plug 313, an ohmic contact layer 314, a first barrier pattern 315, a second barrier pattern 316, and a second plug 317. The first plug 313 may include a silicon plug including polysilicon. The second plug 317 may include a metal plug including tungsten.

An insulating structure including an air gap 318 and a spacer 319 is formed between the storage node contact plug 312 and the bit line 307. The air gap 318 is capped by the first barrier pattern 315. The air gap 318 and the first barrier pattern 315 may be formed by the above described with respect to FIGS. 1-8. A portion of the first barrier pattern 315 that is formed over the top surface and the part of the sidewalls of the ohmic contact layer 314 has a first thickness T1. A portion of the first barrier pattern 315 that is formed over the sidewalls defining the storage node contact hole 311 and over the air gap 318 has a second thickness T2. The first thickness T1 is thicker than the second thickness T2. The first barrier pattern 315 may comprise a titanium layer formed by a PVD-IMP method. The second barrier pattern 316 may comprise a titanium nitride (TiN) layer by a CVD method.

A storage node 320 of a capacitor is formed over the storage node contact plug 312. The storage node 320 comprises a pillar type. Though not illustrated, a dielectric layer and a plate node may be further formed over the storage node 320. In another implementation, the storage node 320 may have a cylinder shape.

As described above, the memory cells comprise a buried gate-type transistor including a buried gate electrode 323, the bit line 307, the storage node contact plug 312, and the capacitor.

The storage node contact plug 312 is separated from sidewalls of the bit line 307 by the air gap 318. Accordingly, a parasitic capacitance between the bit line 307 and the storage node contact plug 312 is reduced.

Figure 11A:
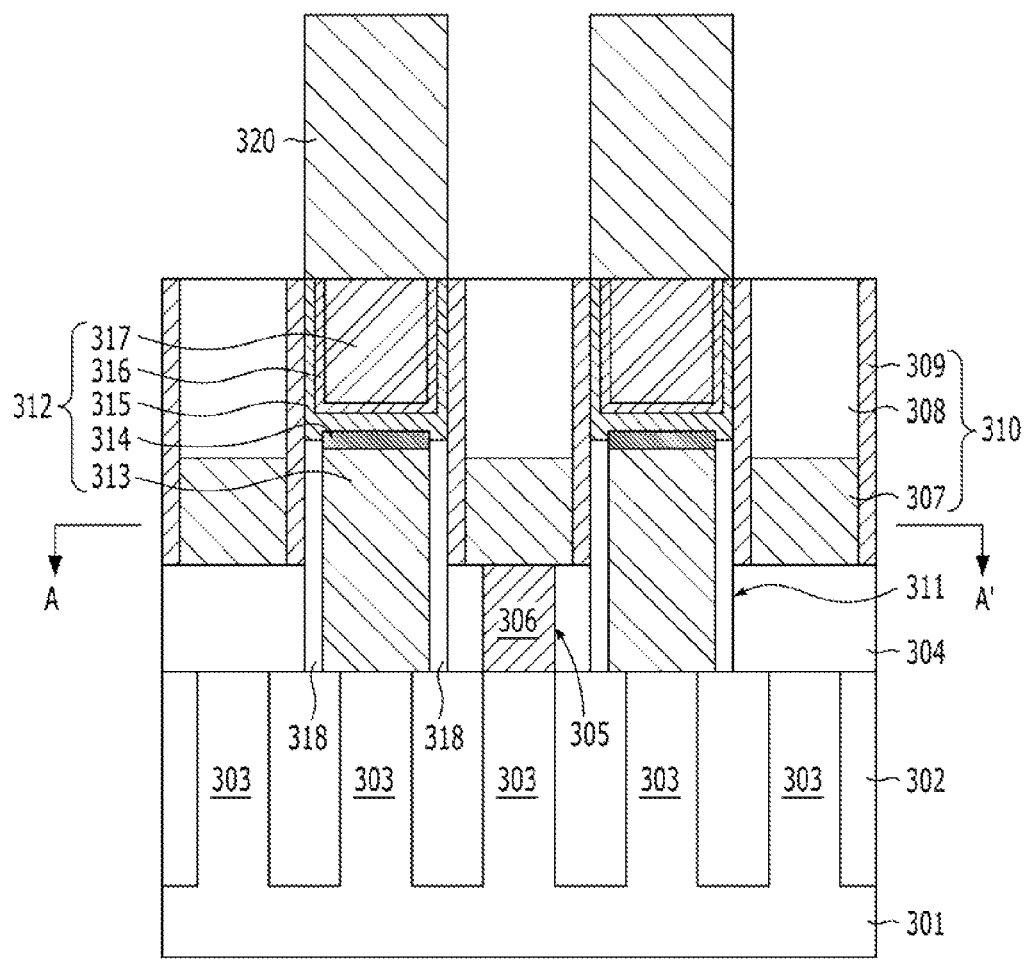
FIG. 11A illustrates a modification to the exemplary memory cells.
Figure 11B:
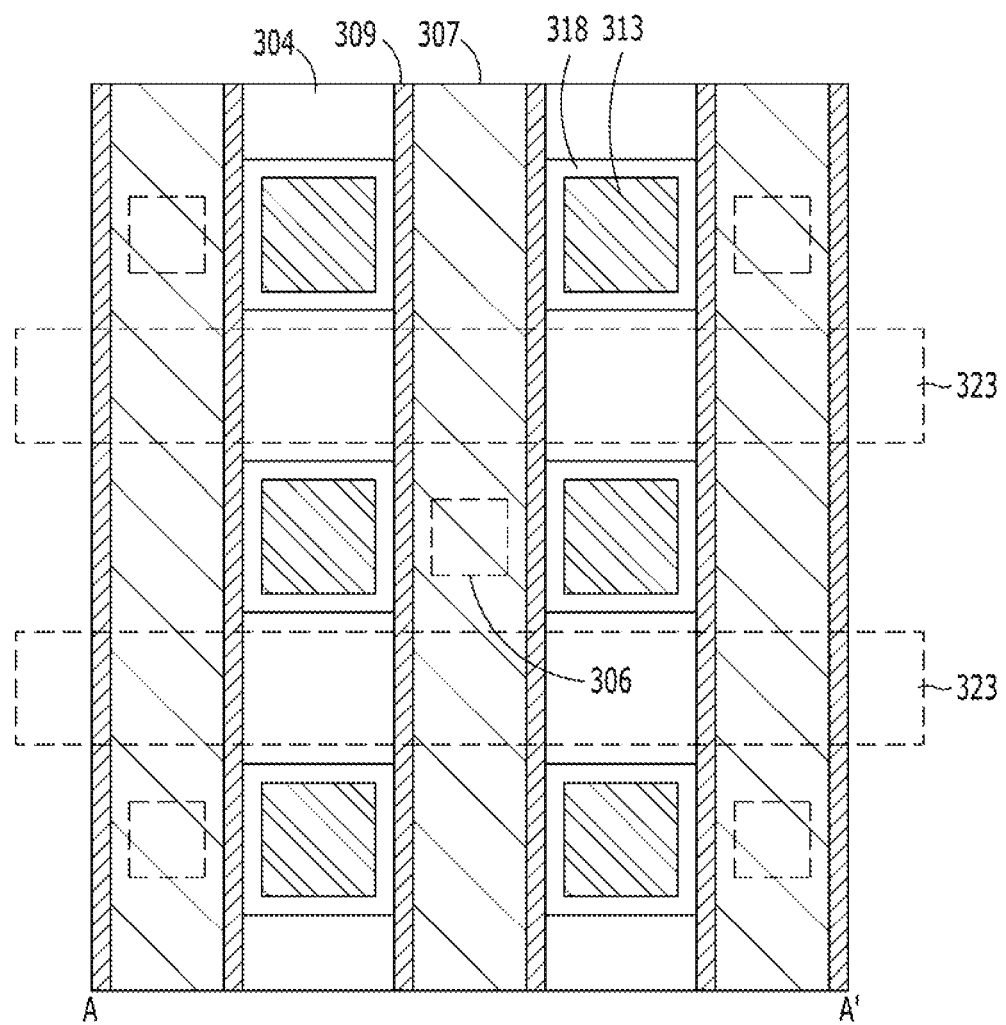
FIG. 11B is a cross-sectional view of the modification to the exemplary memory cells taken along line A-A' of FIG. 11A.

FIGS. 11A and 11B Illustrate a modification to the memory cells of FIGS. 10A-10C. FIG. 11B is a cross-sectional view of the memory cells taken along line A-A' of FIG. 11A.

Referring to FIGS. 11A and 11B, the air gap 318 is formed over the sidewalls defining the storage node contact hole 311 without forming a spacer. That is, the spacer 319 shown in FIG. 10A may be omitted in FIGS. 11A and 11B. In the modified implementation, when the spacer 319 is omitted, a formation area of the ohmic contact layer 314 and a plugging area of the second plug 317 may be increased since a line width of the first plug 313 increases. Accordingly, a line width of the storage node contact plug 312 including the first plug 313 increases. By increasing the line width of the storage node contact plug 312, an overlap margin between the storage node 320 and the storage node contact plug 312.

FIGS. 12A to 12J illustrate an exemplary method for fabricating memory cells.

Figure 12A:
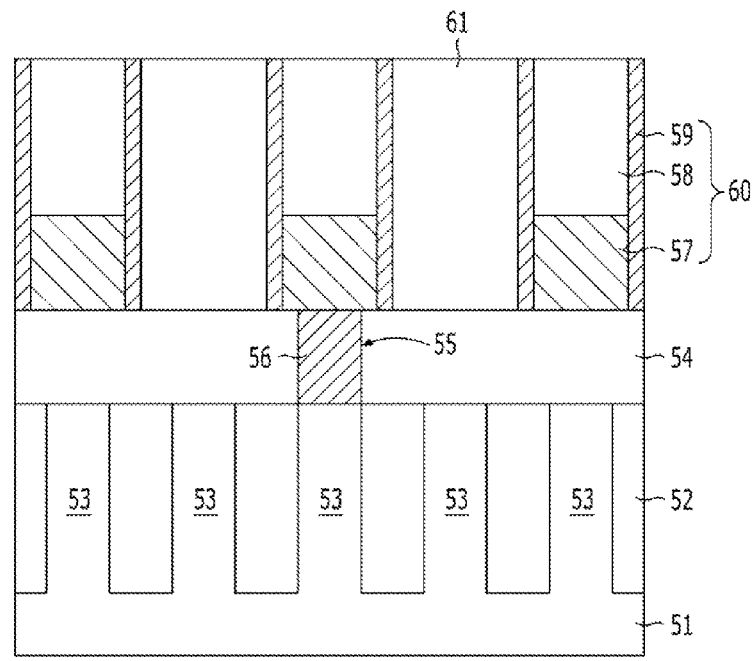
FIGS. 12A to 12J illustrate a method for fabricating the exemplary memory cells.

Referring to FIG. 12A, a substrate 51 may comprise silicon. The substrate 51 may comprise a silicon substrate, a silicon germanium substrate, or the like. Furthermore, the substrate 51 may include a silicon-on-insulator (SOI) substrate.

A device isolation region 52 is formed in a substrate 301. The device isolation region 52 is formed by a shallow trench isolation (STI) process. An active region 53 is defined by the device isolation region 52. The device isolation region 52 may be formed by sequentially stacking a wall oxide, a liner, and a fill material. The liner may include a silicon nitride, a silicon oxide, or the like. The silicon nitride may include $SI_3N_4$, and the silicon oxide may include $SiO_2$. The fill material may include a silicon oxide, such as spin-on dielectric (SOD). Furthermore, the fill material may include a silicon nitride. In an alternative implementation, the silicon nitride used as the liner may be used as the fill material.

Although not illustrated, after forming the device isolation region 52, a buried gate electrode (reference numeral 323 shown in FIG. 10C) may be formed.

Hereinafter, referring to FIG. 10C, a method for forming the buried gate electrode is described.

First, the substrate 301 is etched to form the gate trench 321. Then, the buried gate electrode 323 is formed in the gate trench 321. The sealing layer 324 is formed over the buried gate electrode 323. Before forming the buried gate electrode 323, the gate dielectric layer 322 may be formed along a surface of the gate trench 321. The buried gate electrode 323 may be formed by etching back a metal containing layer after the metal containing layer is formed to fill the gate trench 321. The metal-containing layer may include a metal, such as titanium, tantalum, tungsten, or the like. The metal-containing layer may include tantalum nitride (TaN), titanium nitride (TiN), tungsten nitride (WN), or tungsten (W). For example, the buried gate electrode 323 may have a single layer structure of TiN, TaN, or W, or a dual layer structure of TiN/W or TaN/W formed by stacking W over TiN or TaN. Furthermore, the buried gate electrode 323 may have a dual layer structure of WN/W in which W is stacked over WN. In addition, the buried gate electrode 323 may include a low-resistance metal material. The sealing layer 324 may serve to protect the buried gate electrode 323 during a subsequent process. The sealing layer 324 may include an insulating material. The sealing layer 324 may include silicon nitride. After forming the sealing layer 324, source/drain regions may be formed in the active region 303. Thus, a buried gate-type transistor comprising buried gate electrode formed.

Referring back to FIG. 12A, a first interlayer insulation layer 54 is formed over the entire surface of the substrate 51. The first interlayer insulation layer 54 may include a silicon nitride, a silicon oxide, or the like. An etch stop layer (not shown) including silicon nitride may be formed over the first interlayer insulation layer 54.

The first interlayer insulation layer 54 is etched to form a bit line contact hole 55 to expose a surface of a part of the substrate 51. A mask pattern (not shown) may be used as an etch mask to form the bit line contact hole 55. After forming the bit line contact hole 55, the active region 53 may be recessed in a certain depth. Thus, a contact area between the active region 53 and a bit line contact plug 56 formed in the bit line contact hole 55 may increase. The active region 53 exposed by the bit line contact hole 55 may include a source region or a drain region of the buried gate-type transistor.

The bit line contact plug 56 is formed in the bit line contact hole 55. The bit line contact plug 56 is formed to fill the bit line contact hole 55. After a conductive layer (not shown) is formed over the entire surface of the resulting structure including the first interlayer insulation layer 54, a planarization process is performed on the conductive layer, thereby forming the bit line contact plug 56. The bit line contact plug 56 may include a polysilicon layer or a metal layer.

A bit line 57 and a bit line hard mask 58 are formed over the bit line contact plug 56. In an alternative implementation, if the bit line 57 and the bit line hard mask 58 are adjusted to have a line width smaller than that of the bit line contact hole 55, the bit line contact plug 56 may be etched. In this case, though sidewalls of the bit line contact hole 55 may be exposed as the bit line contact plug 56 is etched, the exposed sidewalls may be filled by using a bit line spacer 59. The bit line 57 may include a metal-containing layer, such as tungsten. The bit line hard mask 58 may include a silicon nitride.

The bit line spacer 59 is formed over sidewalls of the bit line 57 and the bit line hard mask 58. The bit line spacer 59 may include a silicon nitride.

As describe above, after forming the bit line spacer 59, a bit line structure 60 including the bit line 57, the bit line hard mask 58, and the bit line spacer 59 is formed.

A second interlayer insulation layer 61 is formed over the entire surface of the resulting structure including the bit line structure 60. Further, the second interlayer insulation layer 61 may be patterned or planarized to fill a space between adjacent bit line structures 60.

Figure 12B:
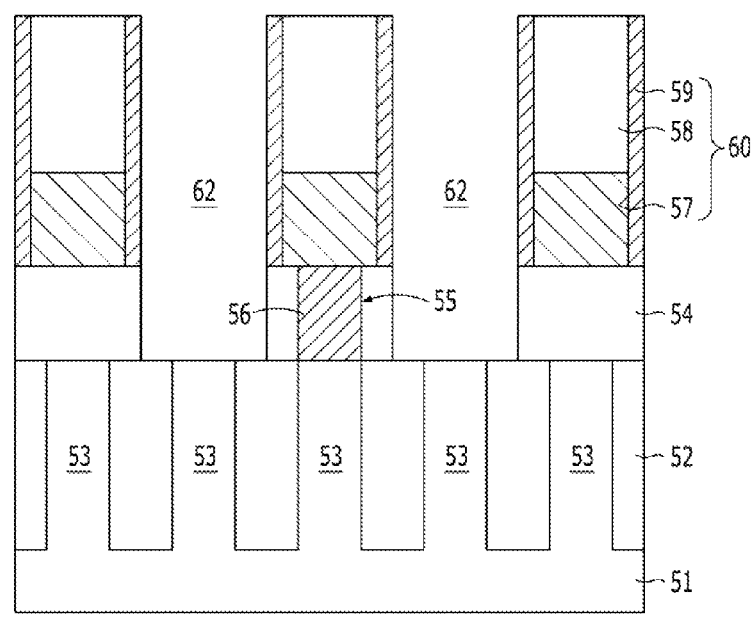

Referring to FIG. 12B, the second interlayer insulation layer 61 and the first interlayer insulation layer 54 are etched using a mask pattern (not shown) as an etch mask. Accordingly, a storage node contact hole 62 is formed between the adjacent bit line structures 60. The bit line structures 60 may be self-aligned by the storage node contact hole 62. Thus, sidewalls of the adjacent bit line structures 60 are exposed by the storage node contact hole 62. A surface of a part of the substrate 51 is exposed by the storage node contact hole 62. The active region 53 exposed by the storage node contact hole 62 may include a source region or a drain region of the buried gate-type transistor. Though not illustrated, a subsequent wet etch may be performed to extend a lower part of the storage node contact hole 62. At this time, a part of the first interlayer insulation layer 54 is isotropically etched.

Figure 12C:
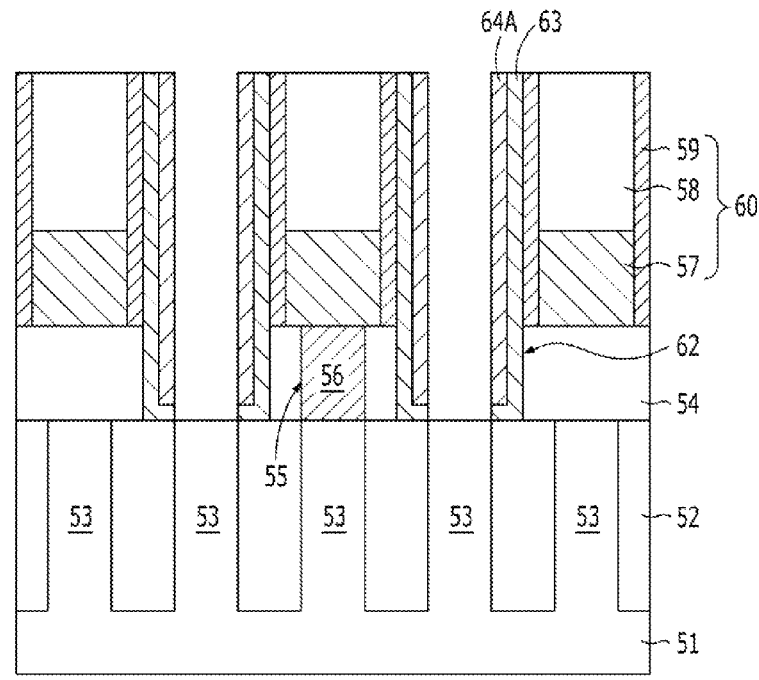

Referring to FIG. 12C, a spacer 63 and a sacrificial spacer 64A are formed over sidewalls of the storage node contact hole 62. For example, an insulation layer (not shown) and a sacrificial layer (not shown) are formed. Then, the sacrificial layer is etched back to from the sacrificial spacer 64A. The insulation layer, which is exposed by the sacrificial spacer 64A, is etched back to form the spacer 63 on the sidewalls defining the storage node contact hole 62. By forming the sacrificial spacer 64A, a surface of the active region 53 below the storage node contact hole 62 is exposed. In an alternative implementation, the sacrificial spacer 64A may be formed without the spacer 63. At this case, a line width of a storage node contact plug may increase.

Figure 12D:
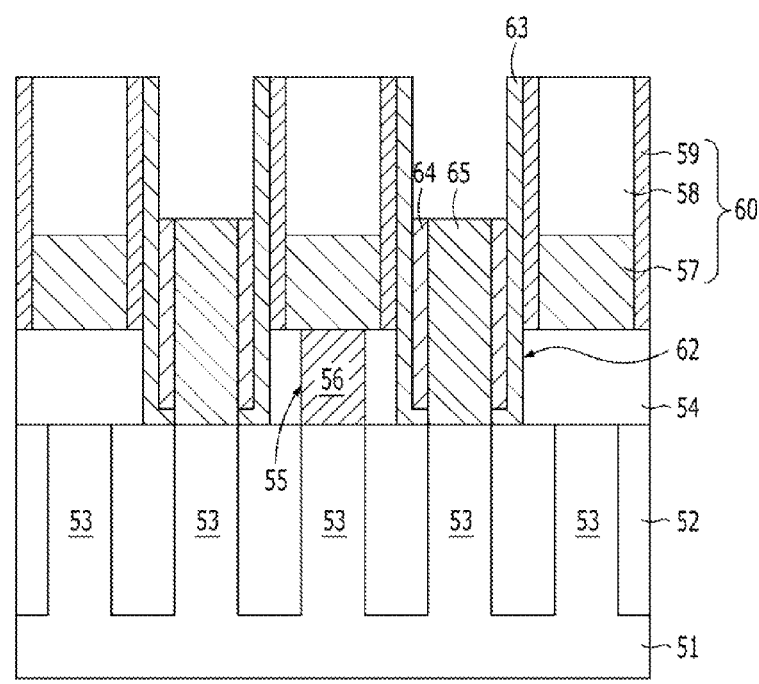

Referring to FIG. 12D, a first plug 65 is formed in the storage node contact hole 62. The first plug 65 is formed to fill a part of the storage node contact hole 62. In other words, the first plug 65 is formed to be recessed in the storage node contact hole 62. A conductive layer (not shown) is formed over the entire surface of the resulting structure to fill the storage node contact hole 62, and the first plug 65 is formed by recessing the conductive layer. The first plug 65 may have a recessed surface higher than a top surface of the bit line 57. The height of the recessed surface of the first plug 65 may be adjusted to minimize a facing area to the bit line 57. Accordingly, parasitic capacitance between the first plug 65 and the bit line 57 may be reduced. The first plug 65 may include a silicon-containing layer. The first plug 65 may include a polysilicon layer. The first plug 65 may include a silicon plug.

A part of the sacrificial spacer 64A is exposed after the first plug 65 is recessed.

Next, the sacrificial spacer 64A is recessed to form a sacrificial spacer 64. The sacrificial spacer 64A is selectively etched so as to form the sacrificial spacer 64 which is recessed. The part of the sacrificial spacer 64A, which is exposed after the first plug 65 is recessed, is recessed in a certain depth. A top surface of the sacrificial spacer 64 may have a height substantially identical to that of the first plug 65. In an alternative implementation, the sacrificial spacer 64 and the first plug 65 may be formed by recessing the sacrificial spacer 64A and the conductive layer at the same time.

Figure 12E:
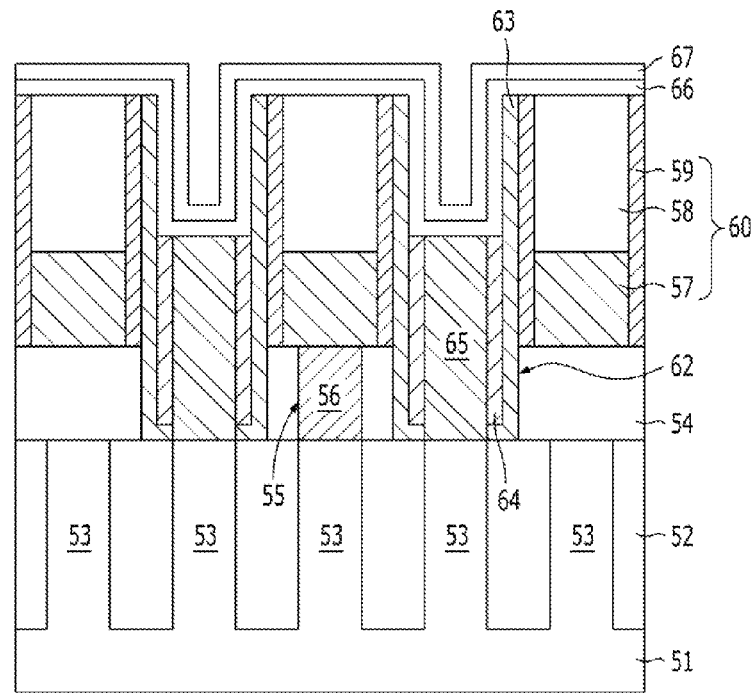

Referring to FIG. 12E, a silicidable layer 66 is formed over the entire surface of the resulting structure including the sacrificial spacer 64. The silicidable layer 66 is conformally formed over the entire surface of the resulting structure including the sacrificial spacer 64. The silicidable layer 66 comprises a material that will form metal silicide via a silicidation reaction with the first plug 65. The silicidable layer 66 may comprise a silicidable metal layer. The silicidable metal layer may include a metal-containing layer comprising metal atoms such as cobalt. If the first plug 65 comprises polysilicon, then the silicidable layer 66 may comprise cobalt.

A protection layer 67 is formed over the silicidable layer 66. The protection layer 67 is conformally formed over the silicidable layer 66. The protection layer 67 prevents an attack of a silicide layer during a subsequent silicidation process. The protection layer 67 may comprise a metal nitride. The protection layer 67 may comprise a titanium-containing layer. The protection layer 67 may comprise titanium nitride. The protection layer 67 may be formed by stacking titanium and titanium nitride.

Figure 12F:
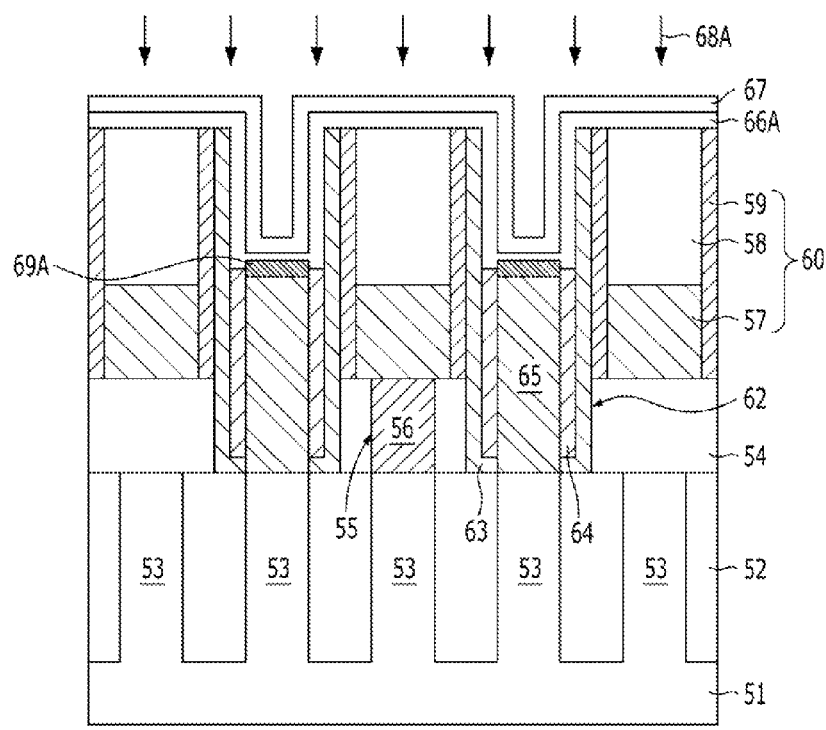

Referring to FIG. 12F, a first annealing process 68A is performed. At this time, since the silicidation reaction occurs due to the first annealing process 68A, the first plug 65 reacts with the silicidable layer 66 to form an ohmic contact layer 69A. In other words, the silicidation reaction occurs at an interface between the first plug 65 and the silicidable layer 66, thereby forming the ohmic contact layer 69A comprising a metal silicide layer. The first annealing process 68A may be performed at a temperature above at least 200° C. to cause the silicidation reaction between the first plug 65 and the silicidable layer 66. The first annealing process 68A may comprise a rapid thermal annealing (RTA) process. Through the first annealing process 68A, silicon of the first plug 65 reacts with metal of the silicidable layer 66 to form the ohmic contact layer 69A. The ohmic contact layer 69A may include a metal silicide. The ohmic contact layer 69A may include cobalt silicide. The ohmic contact layer 69A may include cobalt silicide with a $CoSi_x$ phase. Preferably, the first annealing process 68A is performed at a temperature ranging from approximately 400° C. to approximately 600° C. Through the first annealing process 68A, the ohmic contact layer 69A of cobalt silicide is formed to have the $CoSi_x$ phase, x being from about 0.1 to about 1.5.

After forming the ohmic contact layer 69A, any unreacted silicidable layer may be left, as represented by reference numeral 66A.

Figure 12G:
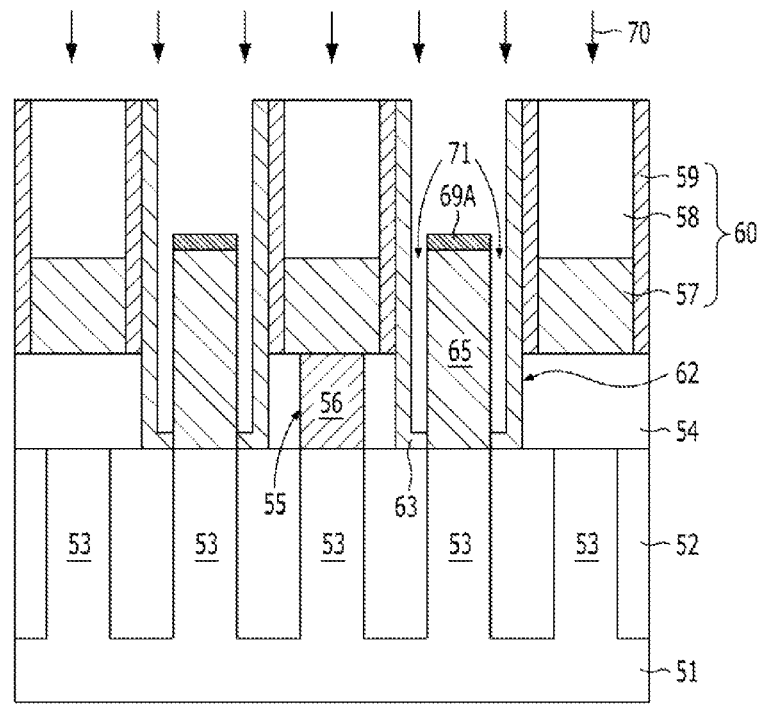

Referring to FIG. 12G, a strip process 70 is performed to remove the protection layer 67 and any unreacted silicidable layer 66A. The strip process 70 may be performed through a clean process using a wet chemical. For example, the clean process may be performed using chemicals based on $H_2SO_4$ (SPM) or $NH_4OH$ (SC-1). Since the protection layer 70 and the sacrificial spacer 64 comprise titanium nitride, the sacrificial spacer 64 is also removed through the strip process 70. As a result, the protection layer 70, the unreacted silicidable layer 66A, and the sacrificial spacer 64 are removed by using one strip process. Accordingly, a loss of surrounding structures may be minimized, and the process may be simplified. Further, loss of the bit line hard mask 58 and the bit line spacer 59 may be minimized.

As described above, the sacrificial spacer 64 is removed through the strip process 70, and a space formed by the removal of the sacrificial spacer 64 becomes an air gap 71. Since the air gap 71 is formed at the same time when the strip process 70 is performed, a loss of the air gap 71 does not occur.

The air gap 71 is formed between the first plug 65 and the sidewalls of the storage node contact hole 62, and an insulation structure including air gap spacer 63 is formed between the first plug 65 and the bit line structure 60.

Figure 12H:
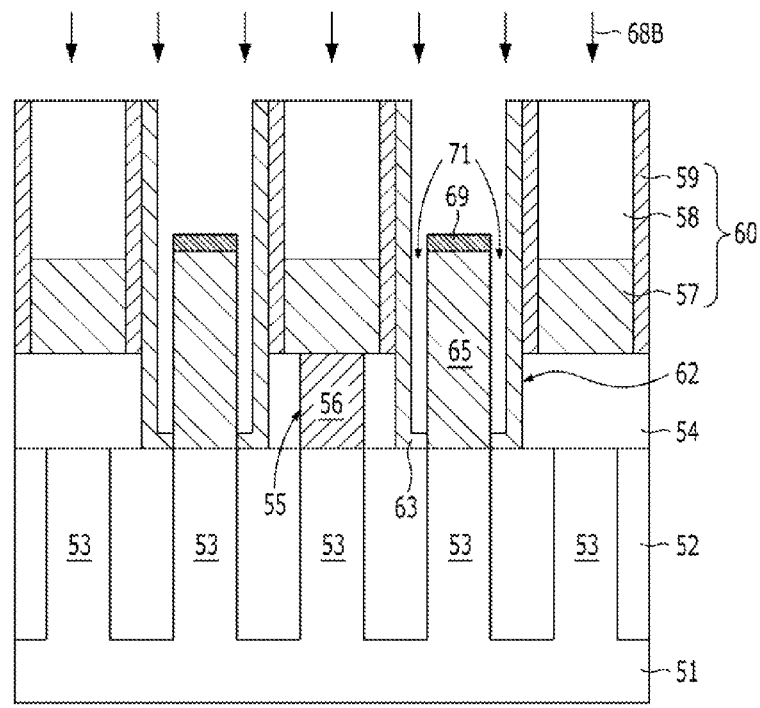

Referring to FIG. 12H, a second annealing process 68B is performed. The second annealing process 68B comprises a rapid thermal annealing (RTA) process. The second annealing process 68B may be performed at a temperature greater than the first annealing process 68A. The second annealing process 68B is performed at a temperature ranging from approximately 600° C. to approximately 800° C. The ohmic contact layer 69A is phase changed by the second annealing process 68B. Thus, a phase-changed ohmic contact layer is represented by reference numeral 69. In other words, through the first annealing process 68A, the ohmic contact layer 69A of cobalt silicide having the $CoSi_x$ phase (x being from about 0.1 to about 1.5) is formed. Through the second annealing process 68B, the ohmic contact layer 69A of cobalt silicide having the $CoSi_x$ phase (x=about 0.1~about 1.5) is changed into the ohmic contact layer 69 of cobalt silicide having a $CoSi_2$ phase. For reference, from among cobalt silicides, cobalt silicide having a $CoSi_2$ phase has the lowest resistivity.

Since the cobalt silicide having the $CoSi_2$ phase is used as the ohmic contact layer 69, contact resistance may be improved and cobalt silicide having sufficient low resistance even in the small area of the storage node contact hole 62 having a fine line width may also be formed.

Figure 12I:
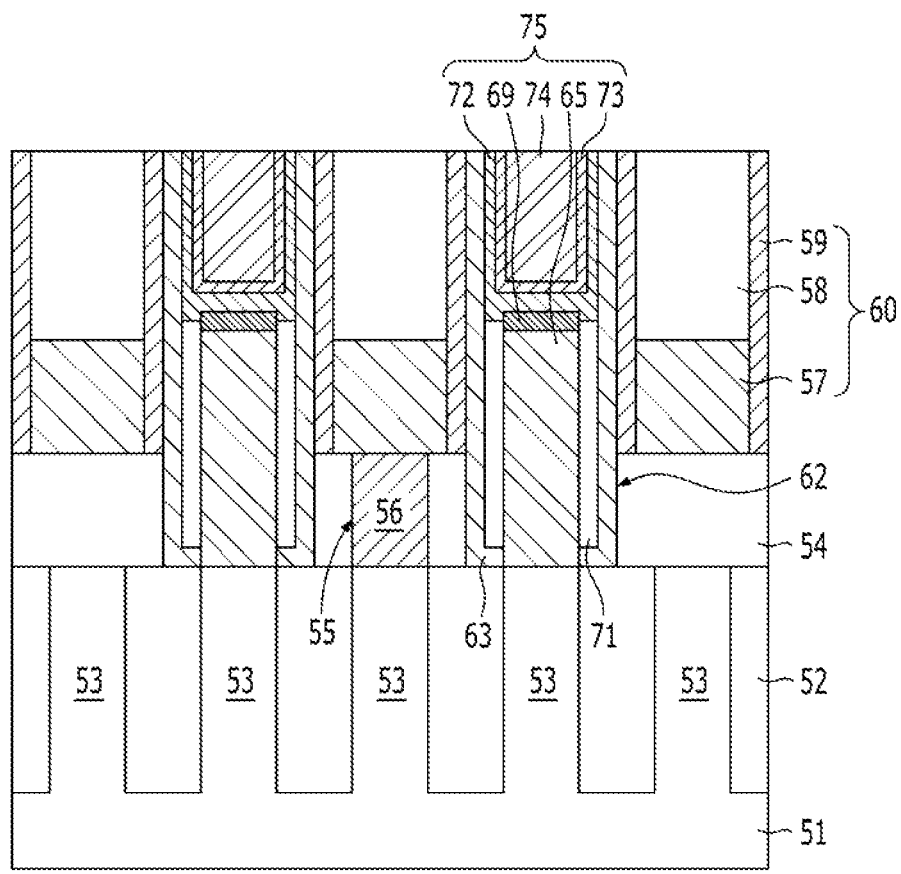

Referring to FIG. 12I, a conductive structure is formed to cap the ohmic contact layer 69 and the air gap. The conductive structure includes a first barrier pattern 72, a second barrier pattern 73, and a second plug 74.

First, the first barrier pattern 72 is formed to cap the air gap 71. A thickness of the first barrier pattern 72 is adjusted to cap the air gap 71 without filling the air gap 71. By adjusting the thickness of the first barrier pattern 72, the first barrier pattern 72 may cover a top surface and a part of the sidewalls of the ohmic contact layer 69. To adjust the thickness of the first barrier pattern 72, a physical vapor deposition in an ionized metal plasma (PVD-IMP) method may be used. The first barrier pattern 72 may comprise a titanium-containing layer. The first barrier pattern 72 may comprise a titanium layer. The titanium layer may be formed by using the PVD-IMP method. (Hereinafter, the titanium layer formed by using the PVD-IMP method is referred to as PVD-IMP Ti.) A portion of the first barrier pattern 72 that is formed over the top surface and the part of the sidewalls of the ohmic contact layer 69 has a first thickness T1. A portion of the first barrier pattern 72 that is formed over the sidewalls of the storage node contact hole 62 and over the air gap 110. As a result, by adjusting the thickness of the first barrier pattern 72 using the PVD-IMP method, a contact area between the first barrier pattern 72 and the ohmic contact layer 69 increases, and a contact resistance is improved as a contact area between the first barrier pattern 72.

Subsequently, a second barrier pattern 73 is formed over the first barrier pattern 72. The second barrier pattern 73 may comprise a titanium-containing layer. The second barrier pattern 73 may comprise a titanium nitride (TiN) layer. The second barrier pattern 73 is formed by using a chemical vapor deposition (CVD) method. (Hereinafter, the TiN layer formed by using the CVD method is referred to as CVD TiN.) Accordingly, since the second barrier pattern 73 has excellent step coverage, the second barrier pattern 73 is formed to have a uniform thickness.

The second plug 74 is formed to fill the storage node contact hole 62 over the second barrier pattern 73. The second plug 74 may include a metal-containing layer. The second plug 74 may include a tungsten layer. The second plug 74 may be a metal plug.

As described above, the first barrier pattern 72, the second barrier pattern 73, and the second plug 74 are formed over the ohmic contact layer 69. Thus, a storage node contact plug 75, which is formed in the storage node contact hole 62, may comprise the first plug 65, the ohmic contact layer 69, the first barrier pattern 72, the second barrier pattern 73, and the second plug 74. The ohmic contact layer 69 forms an ohmic contact between the first plug 65 and the second plug 74. The first barrier pattern 72 and the second barrier pattern 73 prevent a mutual diffusion between the first plug 65 and the second plug 74. When the first plug 65 includes a silicon-containing layer, and the second plug 74 includes a metal-containing layer, the first plug 65 and the second plug 74 forms a semiconductor memory device-metal plug structure.

The air gap 71 is formed between the first plug 65 and the sidewalls of the storage node contact hole 62. As a result, an insulation structure including 'air gap 71-spacer 63' is formed between the storage node contact plug 75 and the bit line structure 60. The air gap 71 is capped by the first barrier pattern 72.

In an alternative exemplary implementation, the air gap 71 and the ohmic contact layer 69 are capped by using only the second plug 74.

Figure 12J:
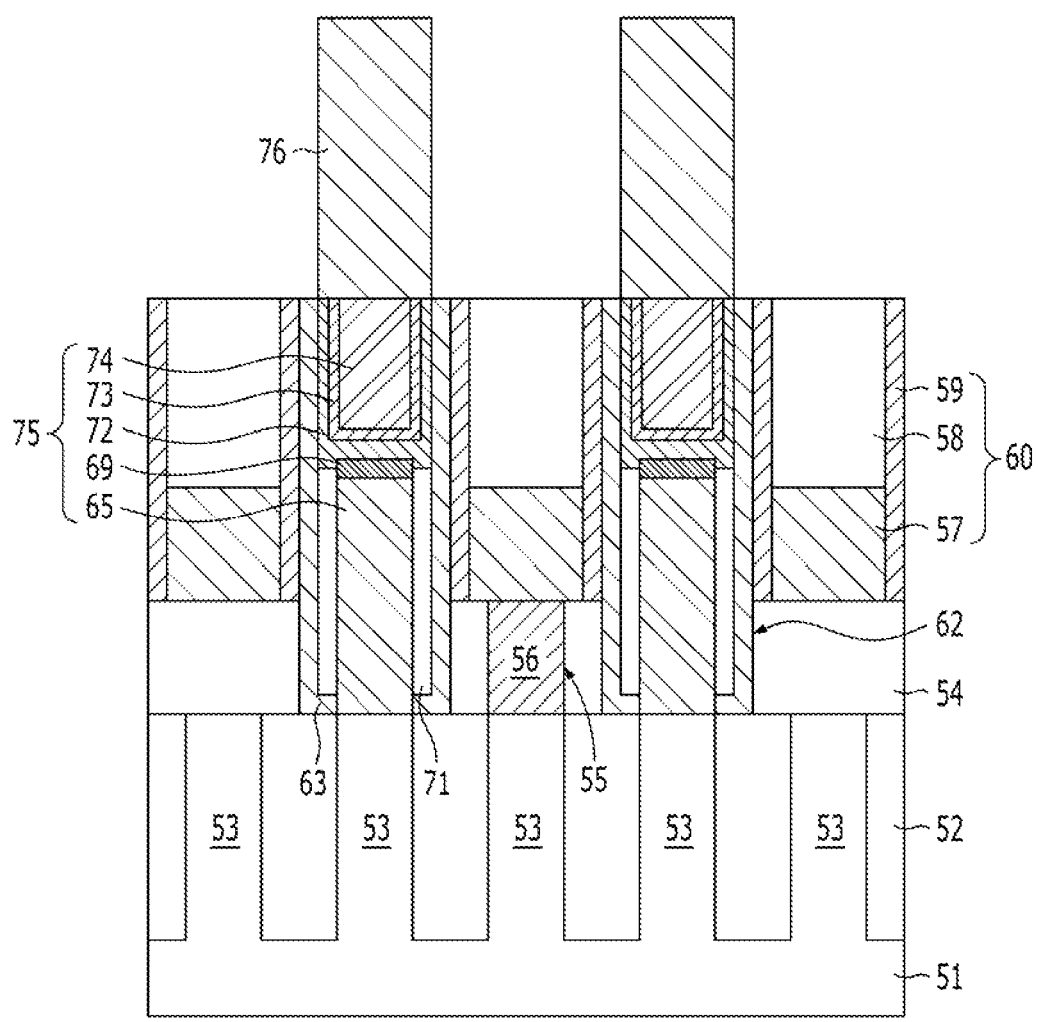

Referring to FIG. 12J, a storage node 76 is formed the storage node contact plug 75. Though not illustrated, a dielectric layer and a plate node may be further formed over the storage node 76. The storage node 76 is formed to have a pillar type. In another implementation, the storage node 76 may have a cylinder shape.

The exemplary semiconductor device may be applied to DRAM (Dynamic Random Access Memory). Without being limited thereto, however, the semiconductor device may be applied to SRAM (Static Random Access Memory), flash memory, FeRAM (Ferroelectric Random Access Memory), MRAM (Magnetic Random Access Memory), PRAM (Phase Change Random Access Memory) or the like.

Figure 13:
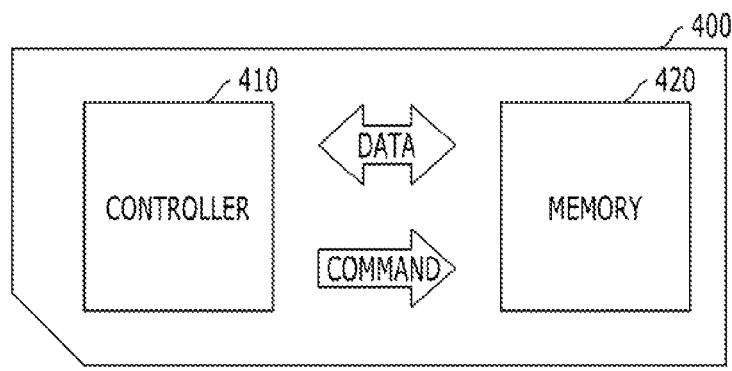
FIG. 13 is a schematic diagram of an exemplary memory card.

FIG. 13 is a schematic diagram of an exemplary memory card.

Referring to FIG. 13, the memory card 400 may include a controller 410 and a memory 420. The controller 410 and the memory 420 may exchange electrical signals. For example, the memory 420 and the controller 410 may exchange data according to a command of the controller 410. Accordingly, the memory card 400 may store data in the memory 420, or output data to the outside from the memory 420. The memory 420 may include the above-described air gap. The memory card 400 may be used as data storage media of various portable devices. For example, the memory card 400 may include a memory stick card, a smart media card (SM), a secure digital card (SD), a mini secure digital card (mini SD), or a multi-media card (MMC).

Figure 14:
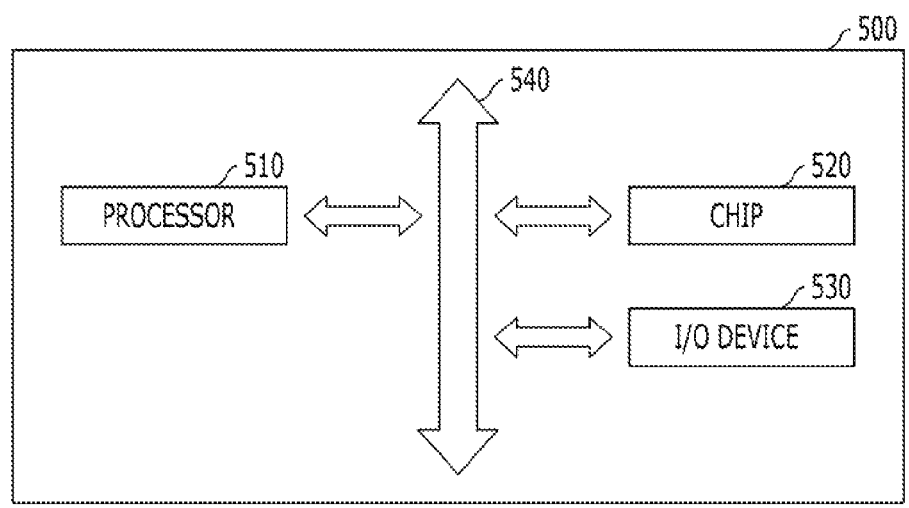
FIG. 14 is a block diagram illustrating an exemplary electronic system.

FIG. 14 is a block diagram illustrating an exemplary electronic system.

Referring to FIG. 14, the electronic system 500 may include a processor 510, an input/output device 530, and a chip 520, which perform data communication through a bus 540. The processor 510 serves to perform a program operation and control the electronic system 500. The input/output device 530 may be used to input or output data of the electronic system 500. The electronic system 500 may be connected to an external device, for example, a personal computer or network, and exchange data with the external device through the input/output device 530. The chip 520 may store codes and data for the operation of the processor 510, and may process a part of operations assigned by the processor 510. For example, the chip 520 may include the above-described air gap. The electronic system 500 may form various electronic control devices requiring the chip 520. For example, the electronic system 500 may be applied to a mobile phone, an MP3 player, a navigation system, a solid state disk (SSD), or a household appliance.

In accordance with the above-described exemplary implementations, as the air gap is formed between the conductive structures, parasitic capacitance may be reduced by a low dielectric constant of the air gap.

Furthermore, in accordance with the above-described exemplary implementations, as an air gap and an ohmic contact layer are formed at the same time through one strip process, the air gap may be stably implemented without loss of surrounding structures.

Furthermore, in accordance with the above-described exemplary implementations, as an air gap is capped using a barrier pattern, the air gap may be stably implemented.

In accordance with the above-described exemplary implementations, by increasing a plugging area of a plug and a formation area of an ohmic contact layer, contact resistance may be increased.

Finally, in accordance with the above-described exemplary implementations, both of the parasitic capacitance and the contact resistance are improved.

Although various exemplary implementations of the have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:
    forming a plurality of first conductive patterns over a substrate;
    forming an insulation layer over an entire surface of the substrate including the first conductive patterns;
    forming an open portion between the first conductive patterns by etching the insulation layer;
    forming a sacrificial spacer over sidewalls of the open portion;
    forming a second conductive pattern over the sacrificial spacer in a lower section of the open portion;
    forming an ohmic contact layer over the second conductive pattern;
    forming an air gap by removing the sacrificial spacer;
    capping the air gap by forming a barrier layer over the ohmic contact layer; and
    forming a third conductive pattern over the barrier layer to fill an upper section of the open portion,
    wherein the capping of the air gap comprises:
        forming a first barrier layer over the ohmic contact layer to cap the air gap; and
        forming a second barrier layer over the first barrier layer,
    wherein a portion of the first barrier layer that is formed over a top surface and sidewalls of the ohmic contact layer has a first thickness, and a portion of the first barrier layer that is formed over the sidewalls of the open portion over the air gap has a second thickness that is less than the first thickness.

2. The method of claim 1, wherein the first barrier layer is formed by a physical vapor deposition in an ionized metal plasma (PVD-IMP) method.

3. The method of claim 1, wherein the first barrier layer or the second barrier layer comprise titanium-containing materials.

4. The method of claim 1, further comprising:
    performing an annealing process to induce a phase change in the ohmic contact layer after the forming the air gap.

5. The method of claim 4, wherein the ohmic contact layer includes cobalt silicide having a $CoSi_x$ phase (wherein x=about 0.1 to about 1.5), and wherein the causing a phase change in the ohmic contact layer further comprises:
    changing, by the annealing process, the cobalt silicide having the $CoSi_x$ phase (wherein x=about 0.1 to about 1.5) into cobalt silicide having a $CoSi_2$ phase.

6. The method of claim 1, wherein the plurality of first conductive patterns comprise a plurality of bit lines, and the second conductive pattern, the ohmic contact layer, and the third conductive pattern comprises a storage node contact plug.

7. The method of claim 1, wherein the second conductive pattern comprises a silicon-containing material, and the third conductive pattern comprise a metal-containing material.

8. The method of claim 1, further comprising:
    forming a buried gate-type transistor, including a gate electrode buried in the substrate, before the forming of the plurality of first conductive patterns.

9. The method of claim 1, further comprising:
    forming a capacitor over the third conductive pattern.

* * * * *